(12) United States Patent
Hu et al.

(10) Patent No.: US 11,955,447 B2
(45) Date of Patent: Apr. 9, 2024

(54) SEMICONDUCTOR CHIP HAVING STEPPED CONDUCTIVE PILLARS

(71) Applicants: ADVANCED MICRO DEVICES, INC., Santa Clara, CA (US); ATI TECHNOLOGIES ULC, Markham (CA)

(72) Inventors: Suming Hu, Markham (CA); Farshad Ghahghahi, Santa Clara, CA (US)

(73) Assignees: ADVANCED MICRO DEVICES, INC., Santa Clara, CA (US); ATI TECHNOOGIES ULC, Markham (CA)

( * ) Notice: Subject to any disclaimer, the term of this patent is extended or adjusted under 35 U.S.C. 154(b) by 141 days.

(21) Appl. No.: 17/528,523

(22) Filed: Nov. 17, 2021

(65) Prior Publication Data
US 2023/0154878 A1 May 18, 2023

(51) Int. Cl.
*H01L 23/00* (2006.01)

(52) U.S. Cl.
CPC .............. *H01L 24/13* (2013.01); *H01L 24/11* (2013.01); *H01L 24/16* (2013.01); *H01L 2224/11622* (2013.01); *H01L 2224/13006* (2013.01); *H01L 2224/13018* (2013.01); *H01L 2224/13541* (2013.01); *H01L 2224/13552* (2013.01); *H01L 2224/13582* (2013.01); *H01L 2224/16227* (2013.01); *H01L 2224/16238* (2013.01)

(58) Field of Classification Search
CPC ....................................... H01L 24/03
See application file for complete search history.

(56) References Cited

U.S. PATENT DOCUMENTS

| | | | |
|---|---|---|---|
| 7,829,380 B2 | 11/2010 | Irsigler et al. | |
| 8,659,155 B2 | 2/2014 | Cheng et al. | |
| 9,324,557 B2 | 4/2016 | Cate et al. | |
| 9,953,939 B2 | 4/2018 | Lin et al. | |
| 10,418,318 B1 | 9/2019 | Darveaux et al. | |
| 2013/0127045 A1* | 5/2013 | Lin | H01L 24/05 257/737 |
| 2018/0358316 A1 | 12/2018 | Kuo et al. | |

* cited by examiner

*Primary Examiner* — William A Harriston

(57) ABSTRACT

In an implementation, a semiconductor chip includes a device layer, an interconnect layer fabricated on the device layer, the interconnect layer including a conductive pad, and a conductive pillar coupled to the conductive pad. The conductive pillar includes at least a first portion having a first width and a second portion having a second width, the first portion being disposed between the second portion and the conductive pad, wherein the first width of the first portion is greater than the second width of the second portion.

20 Claims, 21 Drawing Sheets

Provide A Semiconductor Chip Substrate Including A Conductive Pad And A Passivation Layer Through Which The Conductive Pad Is At Least Partially Exposed 2202

Fabricate An Under-Bump Metallization Layer Over An Exposed Portion Of The Conductive Pad 2204

Fabricate A First Portion Of The Conductive Pillar Over The Conductive Pad, Wherein The First Portion Of The Conductive Pillar Has A First Width 2206

Fabricate A Second Portion Of The Conductive Pillar On The First Portion, Wherein The Second Portion Has A Second Width That Is Smaller Than The First Width 2208

FIG. 22

SEMICONDUCTOR CHIP HAVING STEPPED CONDUCTIVE PILLARS

BACKGROUND

Generally, semiconductor chips comprise active devices (e.g., transistors, capacitors, etc.), and an interconnect layer forming connections to the active devices, and input/output (I/O) contacts to provide signal pathways, power, and ground for the interconnection layers and active devices. The interconnect layer generally includes dielectric layers and metal layers that provide all of the required connections between the active devices and the I/O contacts (and between individual active devices). These dielectric layers can be formed from extremely low-k (ELK) dielectric materials with dielectric constants (k-value) less than 3. The ELK dielectric materials provide several advantages, including reduced parasitic capacitance, faster switching speeds, and lower heat dissipation compared to other conventional dielectric materials such as silicon dioxide ($SiO_{x2}$).

BRIEF DESCRIPTION OF THE DRAWINGS

FIG. 22 sets forth an additional flowchart of the example method of fabricating a semiconductor chip having stepped conductive pillars according to some implementations.

DETAILED DESCRIPTION

Figure 1:
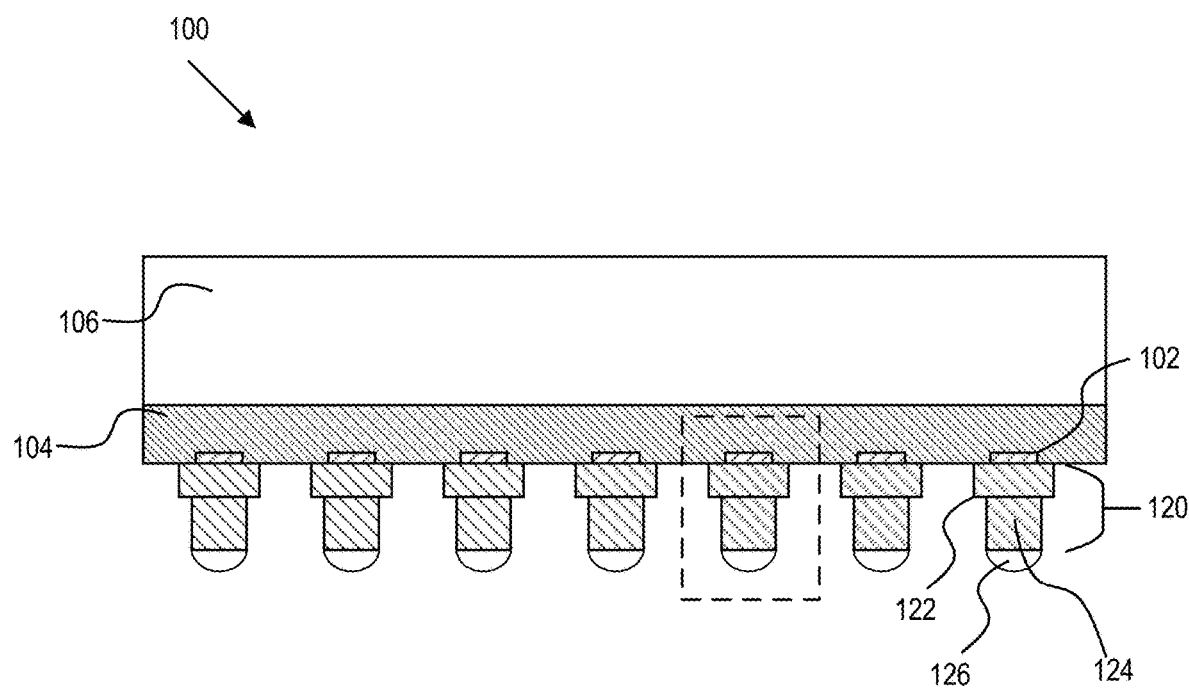
FIG. 1 sets forth a sectional view of an example semiconductor chip having stepped conductive pillars according to some implementations of the present disclosure.

While ELK materials may be used to improve the electrical characteristics of the metallization layers and thereby increase the overall speed or efficiency of the semiconductor device, these materials have a significant structural drawback. With the reduction in the k-value (i.e., the dielectric constant value), the hardness and mechanical modulus of the ELK material are reduced, resulting ELK strength reduction. Thus, ELK materials are less capable than other dielectric materials (e.g., $SiO_{x2}$) in handling the stresses applied to them in the semiconductor package. For example, chip-package interactions between the semiconductor chip and the substrate in the semiconductor package can cause delamination or cracking in the semiconductor chip.

Furthermore, with advancements in nanoscale wafer technology, increasing chip performance drives the requirements for a finer pitch between interconnects (e.g., solder bumps, conductive pillars or posts) of the semiconductor chip. In some solutions, the fine pitch between interconnects is achieved by reducing the size of the under-bump metallization (UBM) layer. However, this can further increase stress on the ELK material, causing cracking or delamination. In other solutions, the size of the UBM is increased to mitigate against ELK stress. However, this increases the size of the solder bump, which can lead to solder bridging among fine pitched interconnects.

To that end, various implementations of a semiconductor chip having stepped conductive pillars are described in this specification. The semiconductor chip includes a device layer and an interconnect layer fabricated on the device layer, with the interconnect layer including a conductive pad. The semiconductor chip also includes a conductive pillar coupled to the conductive pad. The conductive pillar includes at least a first portion having a first width and a second portion having a second width, with the first portion being disposed between the second portion and the conductive pad. The first width of the first portion is greater than the second width of the second portion. In some implementations, the semiconductor chip further includes a solder cap on an end of the second portion. In some implementations, the interconnect layer includes extremely low-k (ELK) dielectric material.

In some implementations, the conductive pillar forms a stepped cylinder. In other implementations, the conductive pillar forms a stepped cuboid.

In some implementations, the conductive pillar includes a third portion disposed between the first portion and the second portion, the third portion having a third width that is smaller than the second width.

In some implementations, the semiconductor chip includes a passivation layer formed on the interconnect layer, a polymer layer formed on the passivation layer, an aperture through the passivation layer and the polymer layer where the aperture exposes a portion of the conductive pad, and an under-bump metallization layer formed on at least the exposed portion of the conductive pad and coupling the conductive pillar to the conductive pad.

In some implementations, the semiconductor chip includes a passivation layer formed on the interconnect layer, an aperture in the passivation layer, where the aperture exposes a portion of the conductive pad, an under-bump metallization layer formed on at least the exposed portion of the conductive pad and coupling the conductive pillar to the conductive pad, and a polymer layer formed on the first portion of the conductive pillar and the under-bump metallization layer.

In some implementations, the semiconductor chip includes a passivation layer formed on the interconnect layer, a first polymer layer formed on the passivation layer, an aperture in the passivation layer and the first polymer layer, where the aperture exposes a portion of the conductive pad, an under-bump metallization layer formed on at least the exposed portion of the conductive pad and coupling the conductive pillar to the conductive pad, and a second polymer layer formed on the first portion of the conductive pillar and the under-bump metallization layer.

A variation of the embodiment is directed to a semiconductor chip package including stepped conductive pillars. The semiconductor chip package includes a package substrate including a bond pad and a semiconductor chip mounted on the package substrate. The semiconductor chip includes a device layer and an interconnect layer fabricated on the device layer, where the interconnect layer includes a conductive pad. The semiconductor chip also includes a conductive pillar interconnecting the conductive pad and the bond pad of the package substrate. The conductive pillar includes at least a first portion having a first width and a second portion having a second width. The first portion is disposed between the second portion and the conductive pad, and the second portion is disposed between the first portion and the package substrate, where the first width of the first portion is greater than the second width of the second portion. In some implementations, the semiconductor chip also includes a solder cap on an end of the second portion. In some implementations, the interconnect layer includes extremely low-k (ELK) dielectric material. In some implementations of the semiconductor chip package, the conductive pillar forms a stepped cylinder.

In some implementations, the conductive pillar includes a third portion disposed between the first portion and the second portion, the third portion having a third width that is smaller than the second width.

In some implementations, the semiconductor chip in the package includes a passivation layer formed on the interconnect layer, a polymer layer formed on the passivation layer, an aperture through the passivation layer and the polymer layer, the aperture exposing a portion of the conductive pad, and an under-bump metallization layer formed on at least the exposed portion of the conductive pad and coupling the conductive pillar to the conductive pad.

In some implementations, the semiconductor chip in the package includes a passivation layer formed on the interconnect layer, an aperture in the passivation layer, the aperture exposing a portion of the conductive pad, an under-bump metallization layer formed on at least the exposed portion of the conductive pad and coupling the conductive pillar to the conductive pad, and a polymer layer formed on the first portion of the conductive pillar and the under-bump metallization layer.

In some implementations, the semiconductor chip in the package includes a passivation layer formed on the interconnect layer, a first polymer layer formed on the passivation layer, an aperture in the passivation layer and the first polymer layer, the aperture exposing a portion of the conductive pad, an under-bump metallization layer formed on at least the exposed portion of the conductive pad and coupling the conductive pillar to the conductive pad, and a second polymer layer formed on the first portion of the conductive pillar and the under-bump metallization layer.

Another variation of the embodiment is directed to a method of fabricating a semiconductor device having stepped conductive pillars. The method includes providing a semiconductor chip substrate that includes a conductive pad and a passivation layer through which the conductive pad is at least partially exposed. The method also includes fabricating an under-bump metallization layer over an exposed portion of the conductive pad. The method further includes fabricating a first portion of a conductive pillar over the conductive pad, where the first portion of the conductive pillar has a first width. The method further includes fabricating a second portion of the conductive pillar on the first portion, where the second portion has a second width that is smaller than the first width.

In some implementations, fabricating a first portion of the conductive pillar over the conductive pad, where the first portion of the conductive pillar has a first width, includes dispensing a first layer of photoresist material, creating a first cavity in the first layer of photoresist material by photolithography, and forming the first portion of the conductive pillar in the first cavity. In these implementations fabricating a second portion of the conductive pillar on the first portion, where the second portion has a second width that is smaller than the first width, includes dispensing a second layer of photoresist material, creating a second cavity in the second layer of photoresist material by photolithography, the second cavity having a smaller width than the first cavity, forming the second portion of the conductive pillar in the second cavity.

Implementations in accordance with the present disclosure will be described in further detail beginning with FIG. 1. Like reference numerals refer to like elements throughout the specification and drawings. FIG. 1 sets forth a sectional view of an example semiconductor chip 100 in accordance with some implementations of the present disclosure. Implementations of the semiconductor chip 100 are useful in high performance applications, such as a personal computer, a notebook, a tablet, a smart phone, a data center, or applications involving large scale databases and/or analytics including finance, life sciences, and/or artificial intelligence. It will be appreciated that many other applications are possible.

In the example of FIG. 1, the semiconductor chip 100 includes a device layer 106. The device layer 106 includes layers of metallization and dielectric material implementing a variety of integrated circuits that are not depicted for clarity. The semiconductor chip 100 also includes an interconnect layer 104 that include layers of metallization and dielectric material, some of which are not depicted here for clarity. The layers of metallization include conductive structures, such as traces, pads, and vias, that provide routing for power, ground, and input/output ('I/O') signals between external interconnects and components in the device layer 106 and among components in the device layer 106. A final layer of metallization in the interconnect layer 104 includes conductive pads 102.

The conductive pads 102 provide a bond site for external interconnect structures. External interconnect structures such as the conductive pillars 120 are coupled to the exposed portions of the conductive pad 102. The conductive pillars 120 include at least a base portion 122 and an end portion 124. In some variations, the conductive pillars 120 include multiple cylindrical portions 122, 124. In these examples, the width of the base portion 122 is greater than the width of the end portion 124. In other variations, the conductive pillars 120 include multiple portions 122, 124 that are not cylindrical (e.g., cuboid). In these examples, the largest width of the base portion 122 is greater than the largest width of the end portion 124. In some examples, as depicted, a solder cap 126 is disposed on a planar surface of the end portion 124. The solder cap 126 can be composed of a well-known solder material.

As discussed above, it is not desirable to increase the pitch of adjacent solder caps 126 to minimize the risk of solder bridging. To that end, the width of the end portion should not be increased beyond design dimensions. To mitigate the impact of stress on the underlying interconnect layer 104 and to reduce the possibility of cracking and delamination in the interconnect layer 104, the width of the base portion of each conductive pillar 120 is selected to be greater than a particular design requirement for the width of the end portion 124 (e.g., a design requirement for interconnect pitch that necessitates a particular end portion width 224). The greater width of the base portion allows for a greater width of an underbump metallization layer (described in greater detail with respect to FIG. 2) thus providing ELK stress reduction.

Figure 2:
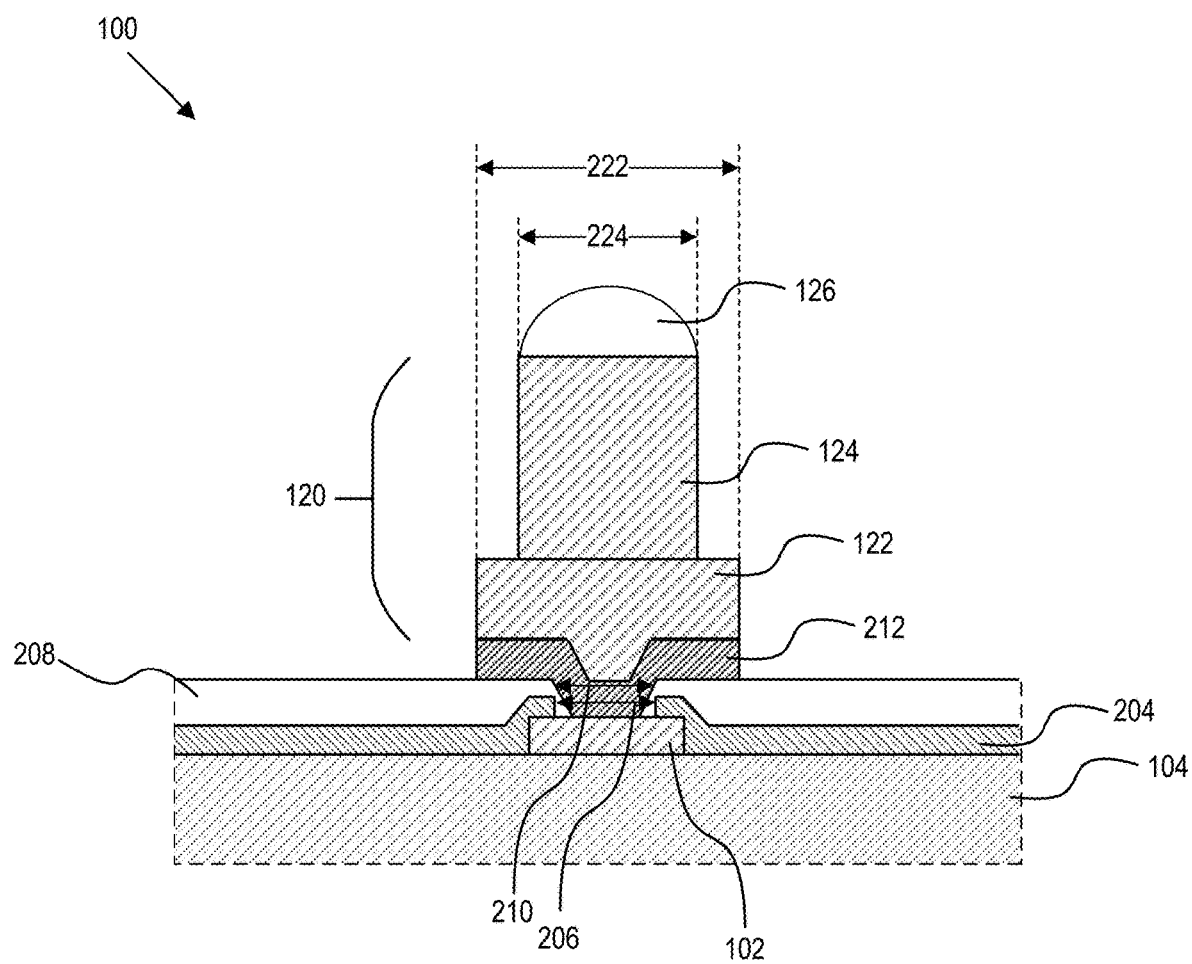
FIG. 2 sets forth a detailed sectional view of the semiconductor chip of FIG. 1 according to some implementations.

For further explanation, FIG. 2 sets forth a detailed view of a portion of the semiconductor chip 100 identified by the dashed rectangle in FIG. 1. To facilitate explanation, the orientation of the semiconductor chip 100 in FIG. 2 is flipped with respect to FIG. 1. In the example of FIG. 2, the interconnect layer 104 (e.g., a back-end-of-line (BEOL) interconnect structure) includes multiple layers of dielectric material including a final dielectric layer supporting the conductive pad 102. In some implementations, the dielectric material is an ELK dielectric. The conductive pad 102 can be composed of a suitable metal or other conductive material. In some implementations, the conductive pad 102 is an aluminum pad or a copper pad.

A passivation layer 204 is formed over the final dielectric layer of the interconnect layer 104. In some variations, as shown, the passivation layer 204 overlaps outer portions of the conductive pad 102. In other variations, the passivation layer 204 abuts the conductive pad 102 without overlap. The passivation layer 204 includes a passivation aperture 206 through which at least a portion of the conductive pad 102 is exposed.

A polymer layer 208 is formed over the passivation layer 204. In some examples, the polymer layer 208 is a polyimide layer. In some implementations, as shown in FIG. 2, the polymer layer 208 extends partially into the passivation aperture 206 and over outer portions of the conductive pad 102. Thus, in these examples, the passivation layer 204 is interposed between the polymer layer 208 and the conductive pad 102. The polymer layer 208 also defines a polymer aperture 210, which exposes the underlying the conductive pad 102. In some examples, as shown, the polymer aperture 210 is smaller than the passivation aperture 206. In other variations, the polymer aperture 210 is greater than the passivation aperture 206. In still further variations, the polymer aperture 210 and the passivation aperture 206 are coterminous.

An under-bump metallization (UBM) layer 212 is formed on the exposed portion of the conductive pad 102 through the passivation aperture 206 and the polymer aperture 210. In some implementations, as shown in FIG. 2, the UBM layer 212 contacts and overlaps portions of the polymer layer 208 adjacent to the polymer aperture 210. The UBM layer 212 is electrically coupled to the conductive pad 102. In various implementations, the UBM layer 212 can be formed from titanium (Ti), titanium tungsten (TiW), and the like. In an implementation, the UBM layer 212 is formed by an adhesion layer of titanium that also acts as diffusion barrier. As shown, the UBM layer 212 defines a UBM width that is equal to the base portion width 222.

The conductive pillar 120 is disposed on the UBM layer 212. The conductive pillar can be formed from copper or another suitable material. In one example, the conductive pillar is formed from copper. The conductive pillar 120 has a shape that includes different widths or diameters along an axis of the conductive pillar 120 perpendicular to the interconnect layer 104. In the example of FIG. 2, a base portion 122 of the conductive pillar 120 proximate to the UBM layer 212 includes sidewalls that define a base portion width 222. In some examples, the base portion width 222 is equal to the UBM layer width. An end portion 124 of the conductive pillar distal to the UBM layer 212 includes sidewalls that define an end portion width 224. In the example of FIG. 2, the conductive pillar is a stepped cylinder with the base portion 122 having a first diameter and the end portion having a second diameter. Where the conductive pillar is an elliptical cylinder having a major axis and a minor axis, the width of each portion is, respectively, the width along the major axis or the widest distance between the sidewalls. Where the base portion 122 and the end portion 122 are not cylindrical (e.g., cuboid), the width of the base portion 122 and the end portion 124 is the largest width between respective lateral faces. When present, the solder cap 126 is formed on the planar surface of the end portion 124, farthest from the interconnect layer 104. In some implementations, a diffusion barrier layer (not shown) is formed between the solder cap 126 and the end portion 124. The diffusion barrier layer can be formed from titanium (Ti), titanium tungsten (TiW), and the like.

As discussed above, increasing the pitch of adjacent solder caps to reduce risk of solder bridging is undesirable. To maintain the pitch, the end portion width 224 should not be increased beyond design dimensions. To mitigate the impact of stress on the underlying interconnect layer 104 and to reduce the possibility of cracking and delamination in the interconnect layer 104 (while maintaining the end portion width 224), the base portion width 222 is selected to be greater than the design requirement for the end portion width 224. The greater base portion width 222 allows for a greater width of the UBM layer thus providing ELK stress reduction.

Figure 3:
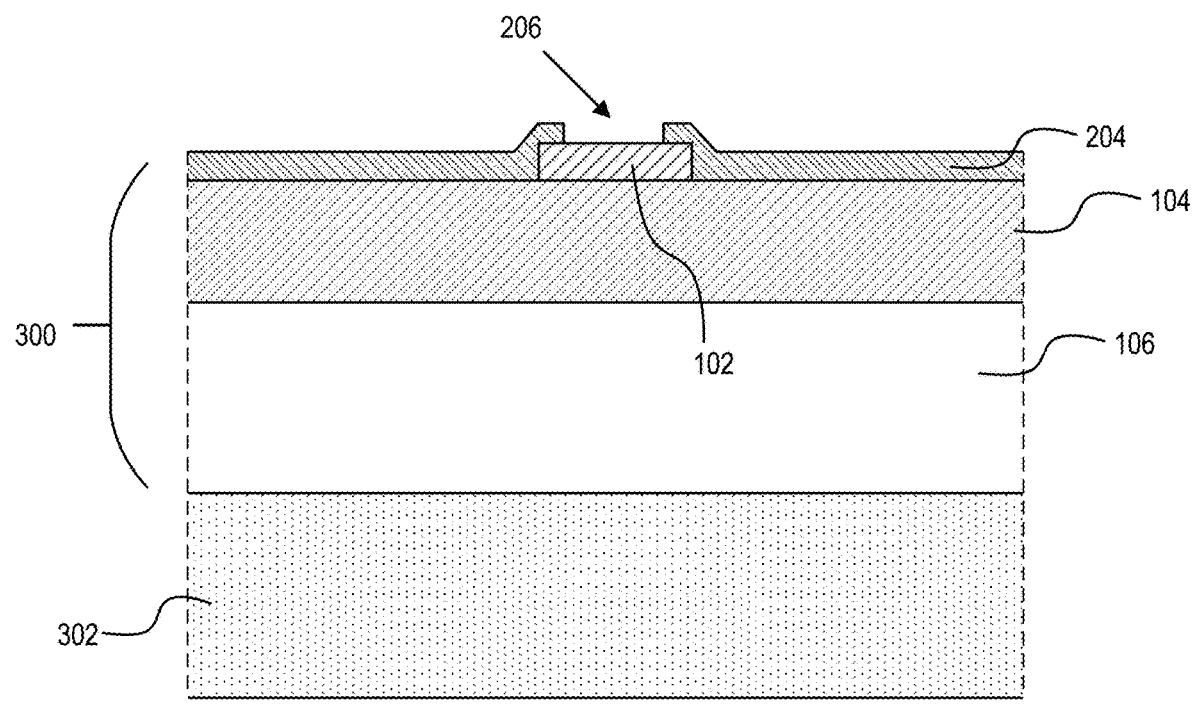
FIG. 3 sets forth a sectional view of a portion of an example process flow for fabricating a semiconductor chip having stepped conductive pillars according to some implementations.

For further explanation, an example process flow for fabricating the stepped conductive pillar structures will now be described in conjunction with FIGS. 3-14 and initially with reference to FIG. 3. For clarity, the process flow depicted in FIGS. 3-14 is illustrated with respect to a single conductive pillar. However, it will be appreciated that, during the process flow for fabricating a stepped conductive pillar structure, multiple stepped conductive pillars can be fabricated.

FIG. 3 is a sectional view that depicts placement of the semiconductor chip substrate 300 on a carrier 302 that supports the semiconductor chip during a bumping process in which the conductive pillars are formed. The semiconductor chip substrate 300 is provided after a wafer-level fabrication process to create the semiconductor chip substrate 300. As such, the semiconductor chip substrate includes the device layer 106 and the interconnect layer 104 formed over the device layer 106.

The interconnect layer 104 includes a final dielectric layer supporting a conductive pad 102. The passivation layer 204 is formed over the final metal layer and, in the example of FIG. 3, over the periphery of the conductive pad 102. The passivation aperture 206 exposes a portion of the conductive pad 102 not overlapped by the passivation layer 204.

Figure 4:
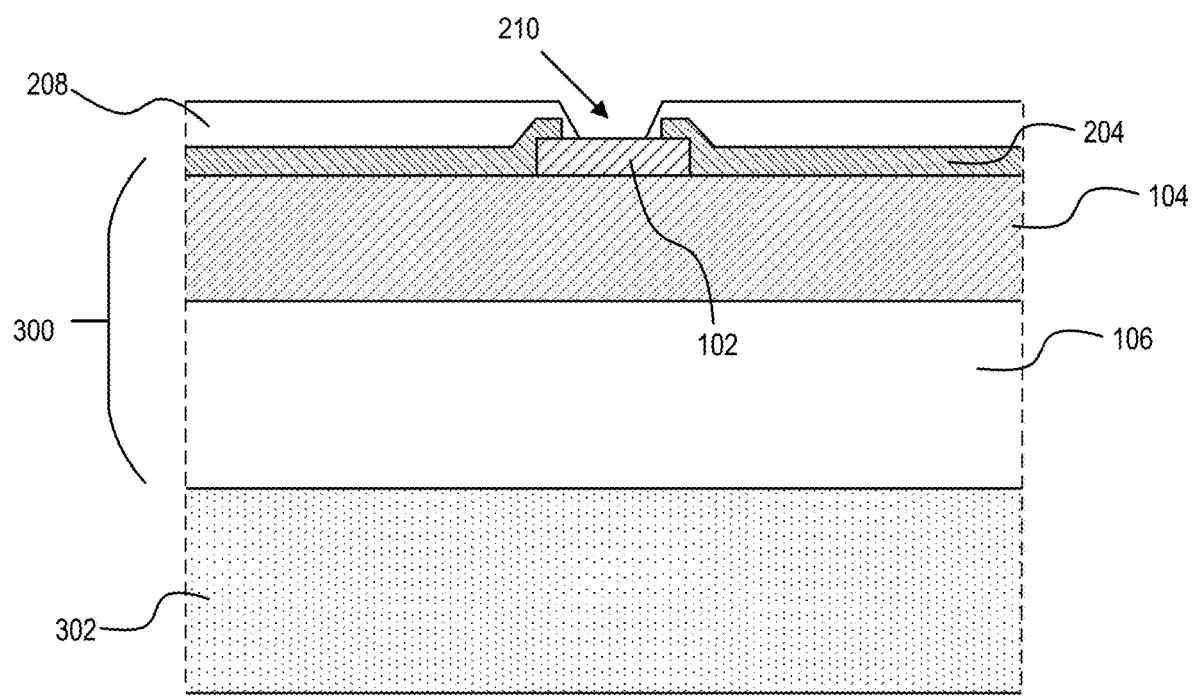
FIG. 4 is another portion of the example process flow for fabricating a semiconductor chip having stepped conductive pillars according to some implementations.

FIG. 4 sets forth a sectional view that depicts deposition of the polymer layer 208. The polymer layer can be composed of a variety of polymeric material. The polymer layer 208 defines the polymer aperture 210 that exposes a portion of the conductive pad 102. In some implementations, the polymer aperture 210 is smaller than the passivation aperture 206 such that some polymer material contacts and overlaps a portion of the conductive pad 102. In other variations, the polymer aperture 210 is larger than the passivation aperture 206 such that the polymer material does not contact the conductive pad. In still further variations, the polymer aperture 210 and the passivation aperture 206 are coterminous, such that the polymer material does not contact the conductive pad 102.

Figure 5:
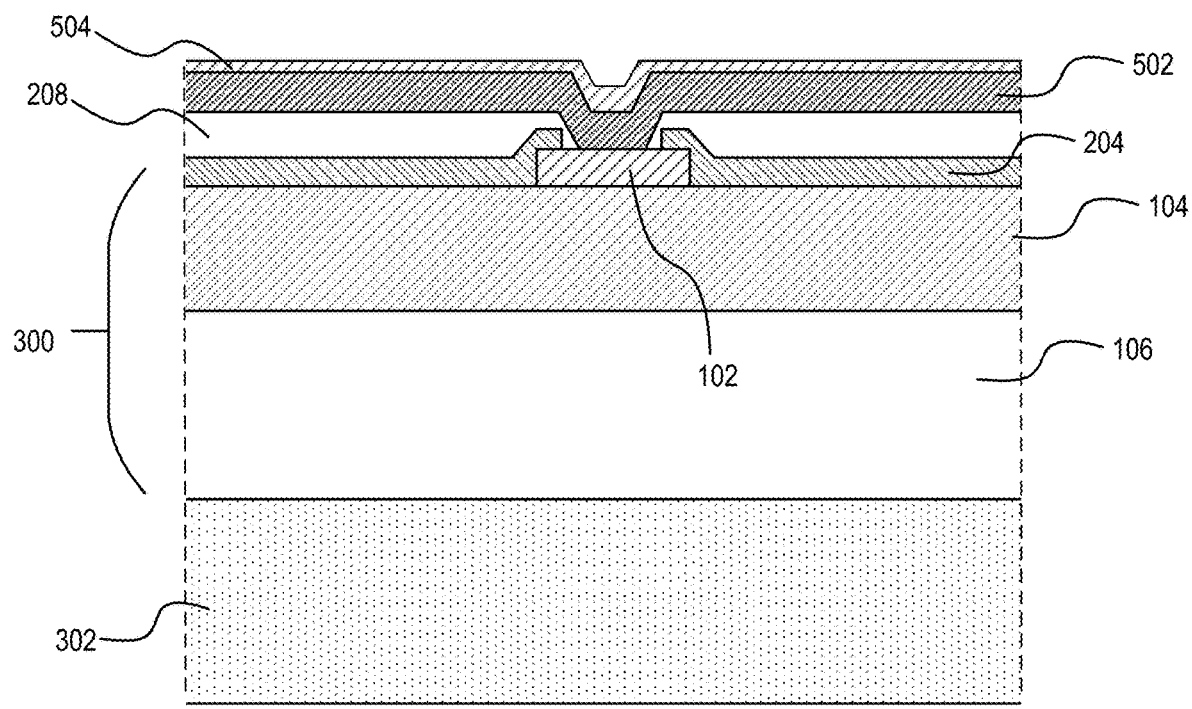
FIG. 5 is another portion of the example process flow for fabricating a semiconductor chip having stepped conductive pillars according to some implementations.

FIG. 5 sets forth a sectional view that depicts deposition of an adhesion layer 502 and a seed layer 504. The adhesion layer 502 can be composed of a variety of suitable materials, including titanium (Ti), titanium tungsten (TiW), and the like, and can be deposited by a variety of well-known techniques. In some implementations, the adhesion layer 502 is composed of titanium (Ti) and deposited by a sputtering process. In these implementations, the adhesion layer 502 also acts as a diffusion barrier. The seed layer 504 can be composed of a variety of suitable materials, including copper (Cu), gold (Au), and the like, and can be deposited by a variety of well-known techniques. In some implementations, the seed layer 504 is composed of copper (Cu) and deposited by a sputtering process. The adhesion layer 502 will later form the UBM layer 212 after an etching process, as will be explained below.

Figure 6:
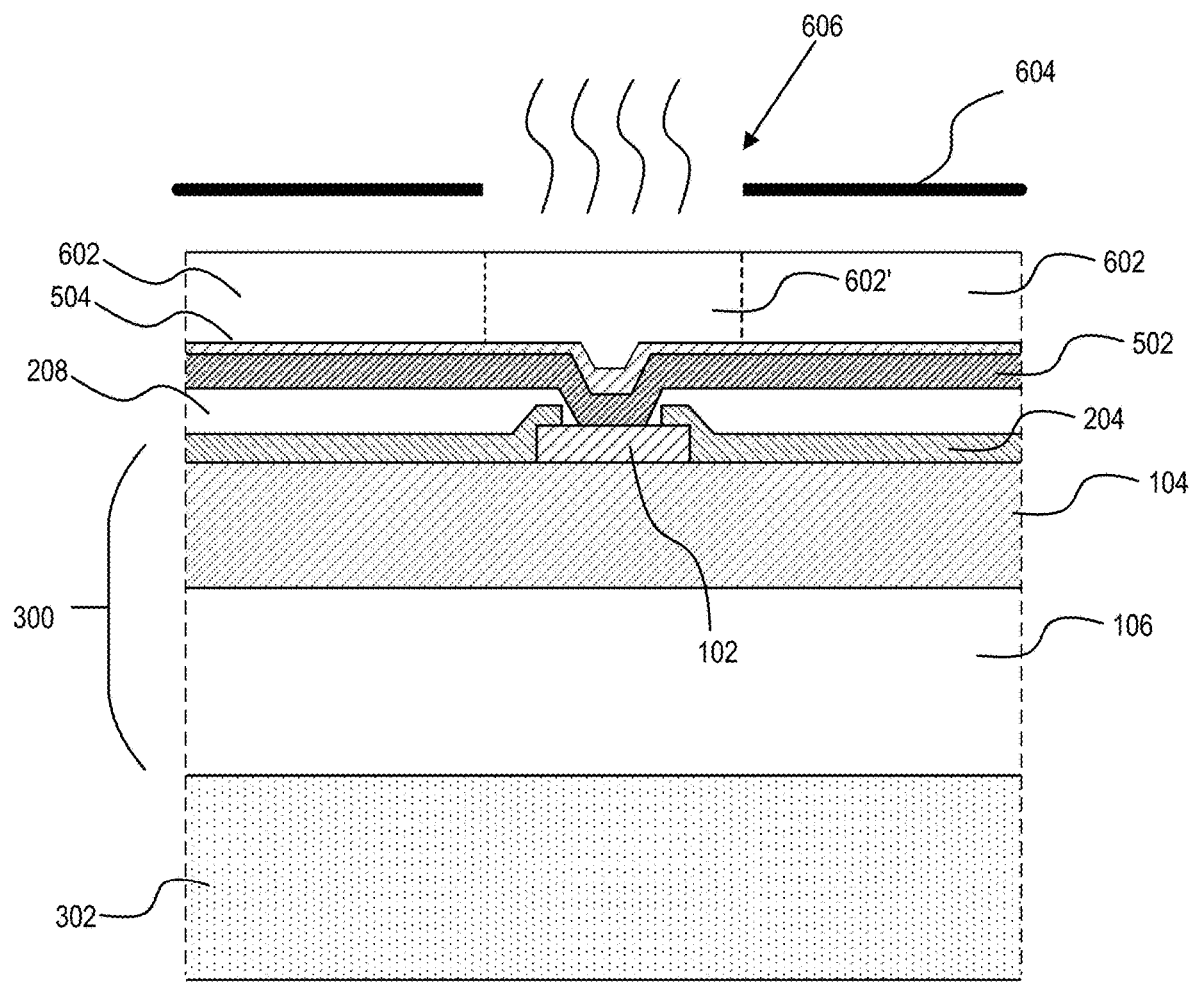
FIG. 6 is another portion of the example process flow for fabricating a semiconductor chip having stepped conductive pillars according to some implementations.

FIG. 6 sets forth a sectional view that depicts a first level of photoresist material 602 dispensed over the seed layer 504. For example, the photoresist material 602 is applied by spin coating. A photomask 604 is placed on or above the photoresist material 602, the photomask 604 having a mask aperture 606 that aligns with the conductive pad 102 (e.g., aligned along a vertical axis through the center of the mask aperture 606 and the center of the conductive pad 102). In some examples the mask aperture 606 has a width that is equal to the eventual base portion width 222. A portion of the photoresist material 602' is exposed to radiation such as UV light through the mask aperture 606.

Figure 7:
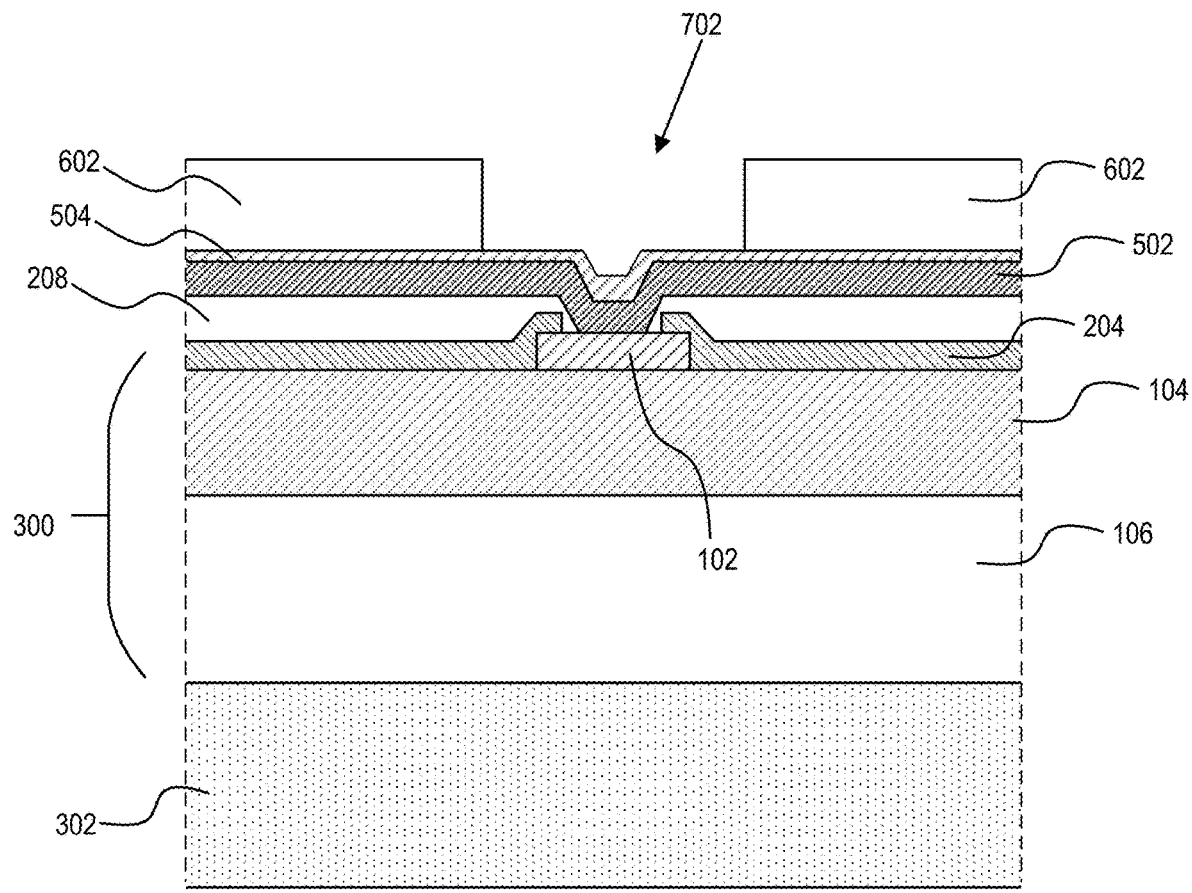
FIG. 7 is another portion of the example process flow for fabricating a semiconductor chip having stepped conductive pillars according to some implementations.

FIG. 7 sets forth a sectional view that depicts development of the photoresist material 602 including the portion of the photoresist material 602', previously shown in FIG. 6, that has undergone exposure. The portion of the photoresist material 602' is removed through the developing process. The removal of photoresist material 602' creates a cavity 702 in the photoresist material 602 that is used to form the base portion 122 of the conductive pillar 120.

Figure 8:
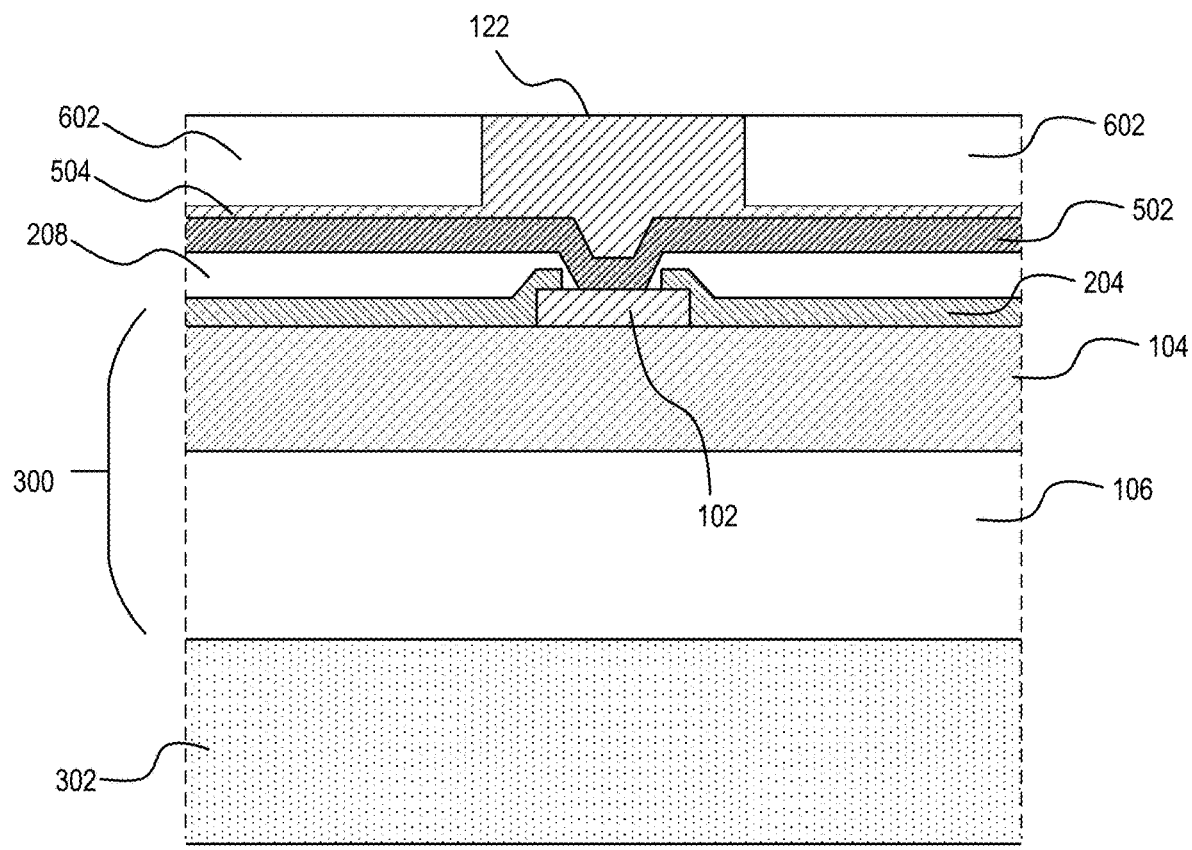
FIG. 8 is another portion of the example process flow for fabricating a semiconductor chip having stepped conductive pillars according to some implementations.

FIG. 8 sets forth a sectional view that depicts fabrication of the base portion 122 of the conductive pillar 120. Metal forming the base portion 122 is deposited on the seed layer 504 in the cavity 702 (previously shown in FIG. 7) through various well-known techniques. In some implementations, the metal is deposited by electroplating. In some examples, the metal is copper (Cu). At this stage, because the base portion 122 and the seed layer 504 are composed of the same metal, the metal of the seed layer 504 in the cavity 702 becomes integrated with the metal of the base portion 122.

Figure 9:
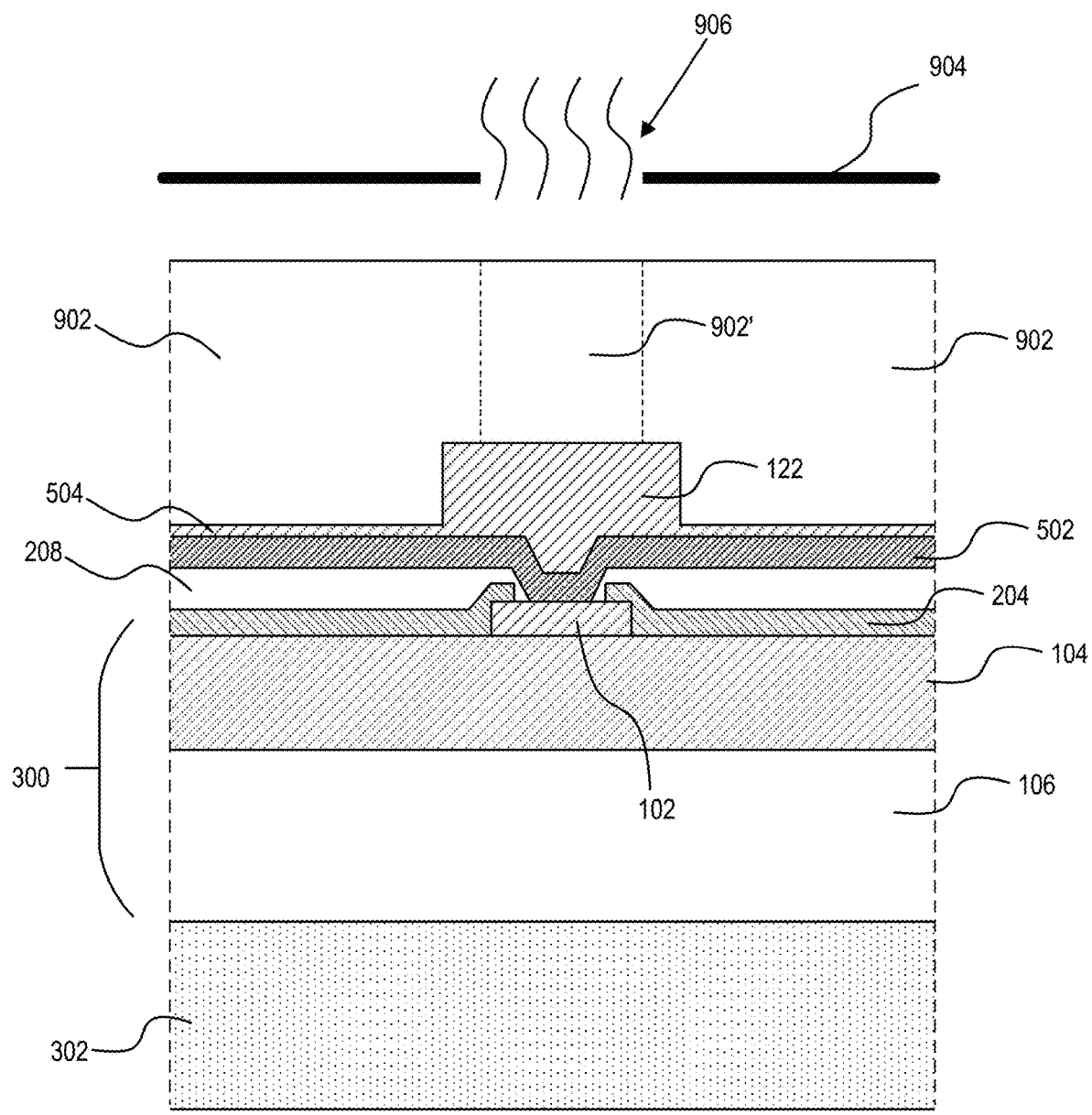
FIG. 9 is another portion of the example process flow for fabricating a semiconductor chip having stepped conductive pillars according to some implementations.

FIG. 9 sets forth a sectional view that depicts a second level of photoresist material 902 dispensed on surfaces of the seed layer 504 and over the periphery of the base portion 122. For example, the photoresist material 902 is applied by spin coating. A photomask 904 is placed on or above the photoresist material 902, the photomask 904 having a mask aperture 906 that aligns with the conductive pad 102. In the example of FIG. 9, the mask aperture is aligned along a vertical axis through the center of the mask aperture 906 and the center of the conductive pad 102. In some implementations, the mask aperture can be offset relative the same vertical axes. In some examples the mask aperture 906 has a width that is equal to the end portion width 224. A portion of the photoresist material 902' is exposed to radiation such as UV light through the mask aperture 906. In some variations, the second level of photoresist material 902 is dispensed without stripping the first level of photoresist material 602.

Figure 10:
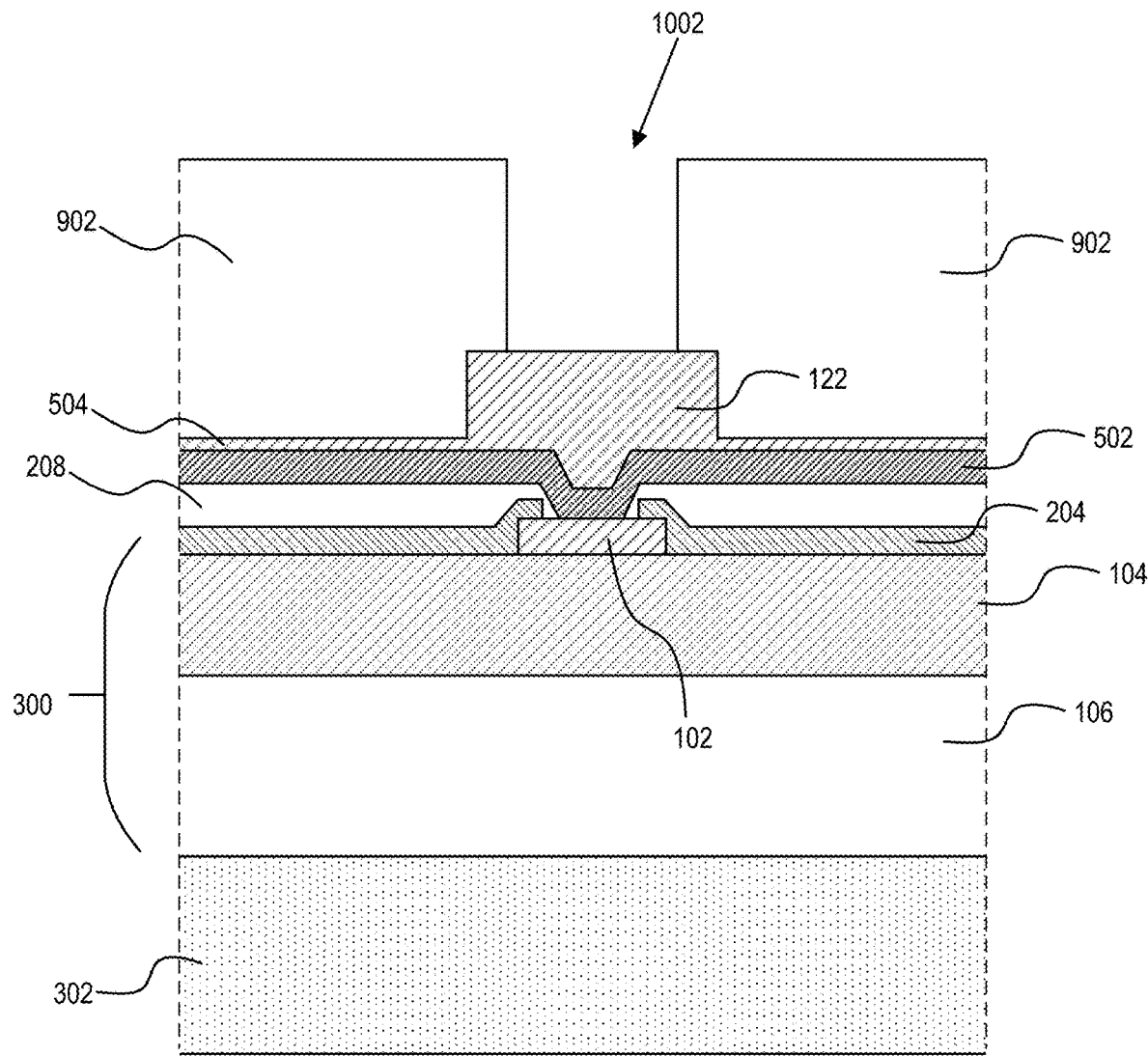
FIG. 10 is another portion of the example process flow for fabricating a semiconductor chip having stepped conductive pillars according to some implementations.

FIG. 10 sets forth a sectional view that depicts development of the photoresist material 902 including the portion of the photoresist material 902' that has undergone exposure. The portion of the photoresist material 902', previously shown in FIG. 9, is removed through the developing process. The removal of photoresist material 902' creates a cavity 1002 in the photoresist material 902 that is used to form the end portion 124 of the conductive pillar 120.

Figure 11:
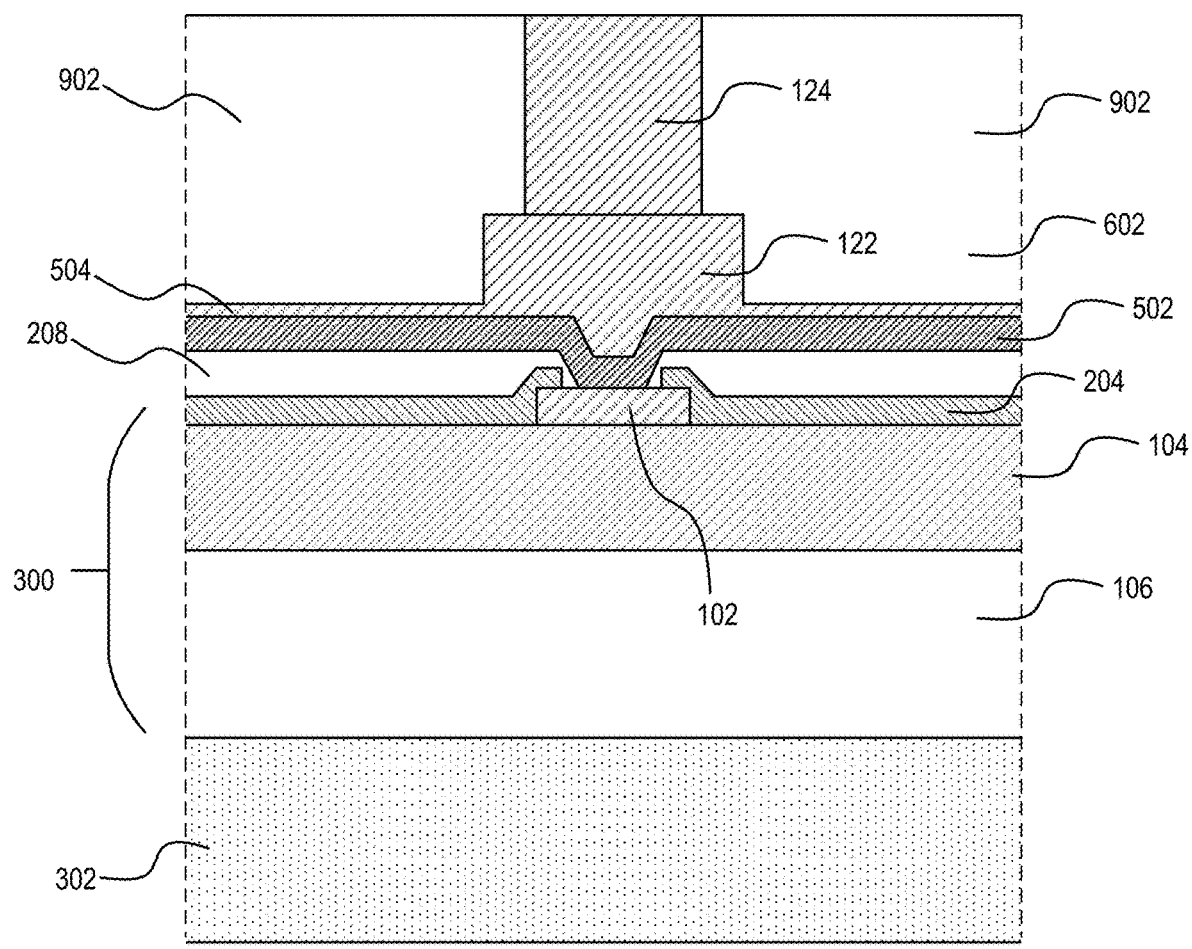
FIG. 11 is another portion of the example process flow for fabricating a semiconductor chip having stepped conductive pillars according to some implementations.

FIG. 11. sets forth a sectional view that depicts fabrication of the end portion 124 of the conductive pillar 120. Metal forming the end portion 124 is deposited in the cavity 1002, previously shown in FIG. 10, through various well-known techniques. The metal (e.g., copper) is the same metal that is used to form the base portion 122. Thus, the deposition of the metal forming the end portion 124 is joined with the metal forming the base portion 122. In some implementations, the metal is deposited by electroplating.

Figure 12:
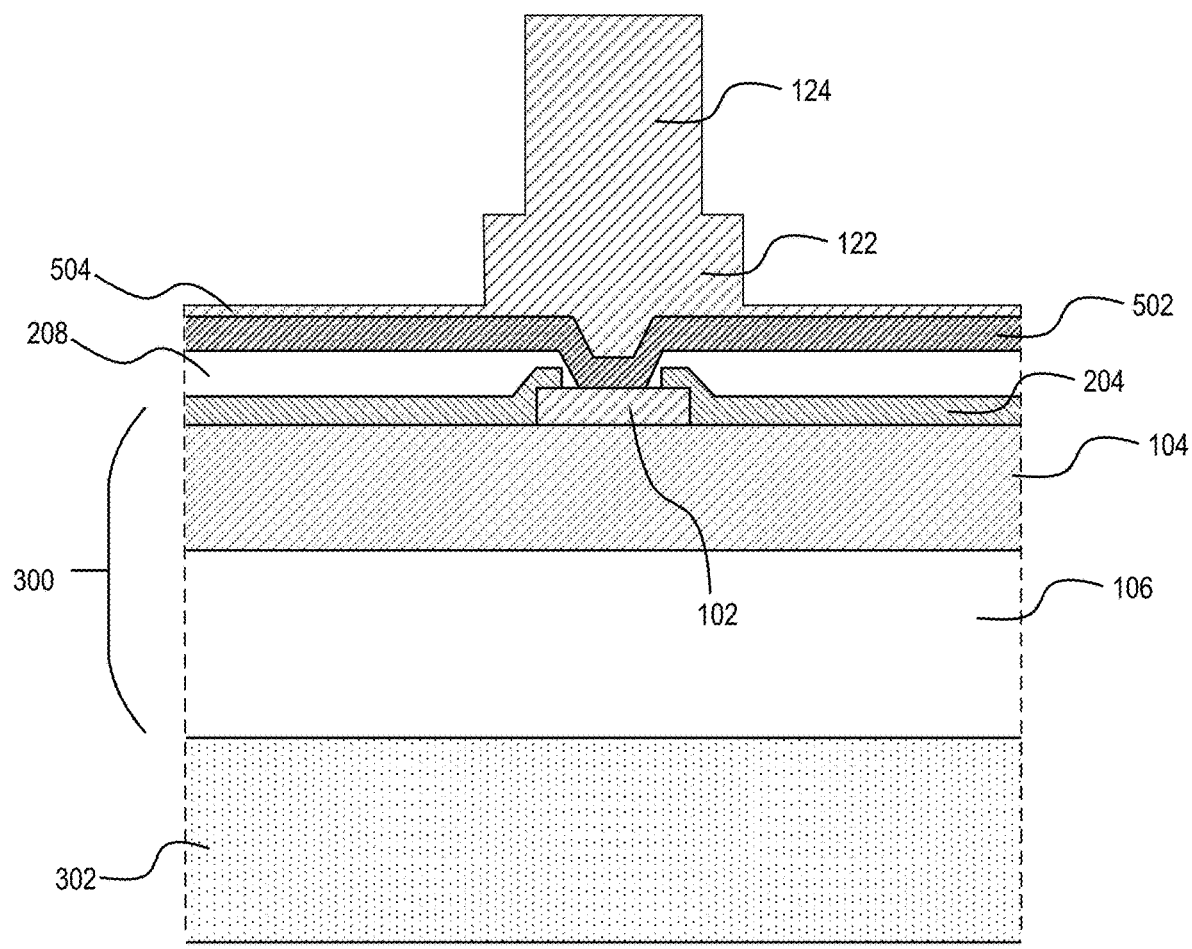
FIG. 12 is another portion of the example process flow for fabricating a semiconductor chip having stepped conductive pillars according to some implementations.

FIG. 12 sets forth a sectional view that depicts removal of the photoresist material 902 previously shown in FIG. 11. The second level of photoresist material 902 can be removed through a well-known stripping process. As depicted in FIG. 12, removal of the photoresist material 902 exposes the conductive pillar 120 including the base portion 122 and the end portion 124, the end portion having a smaller width 224 than the base portion width 222. In alternative implementations where the first level of photoresist material 602 is not stripped before dispensing the second level of photoresist material 902, the photoresist material 602, 902 can be stripped together.

Figure 13:
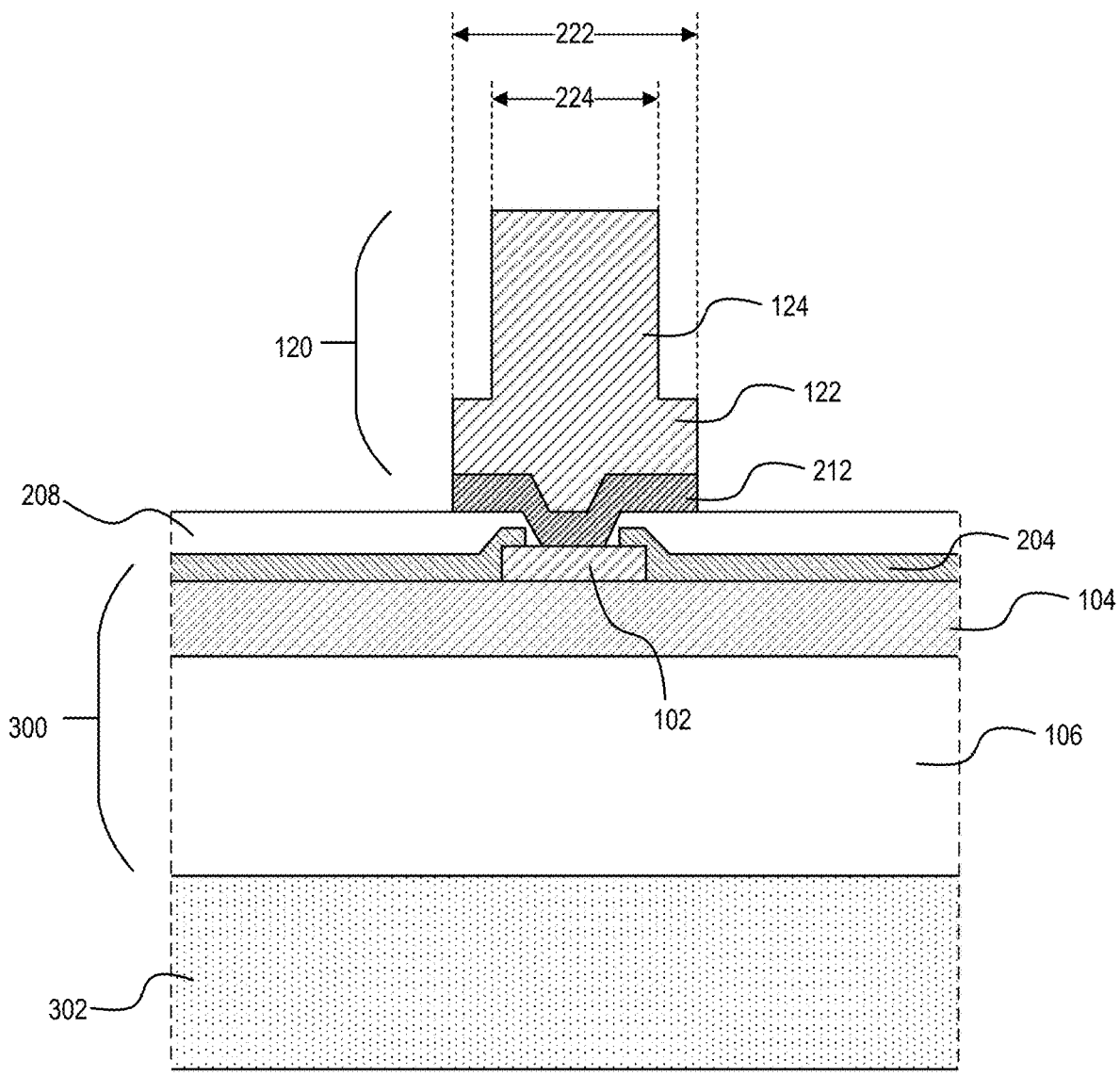
FIG. 13 is another portion of the example process flow for fabricating a semiconductor chip having stepped conductive pillars according to some implementations.

FIG. 13 sets forth a sectional view that depicts removal of the adhesion layer 502 and the seed layer 504, previously shown in FIG. 12, except for portions below the conductive pillar 120. In some implementations, the adhesion layer 502 and the seed layer 504 surrounding the conductive pillar 120 are removed by chemical etching. The remaining portion of the adhesion layer 502 forms the UBM layer 212.

Figure 14:
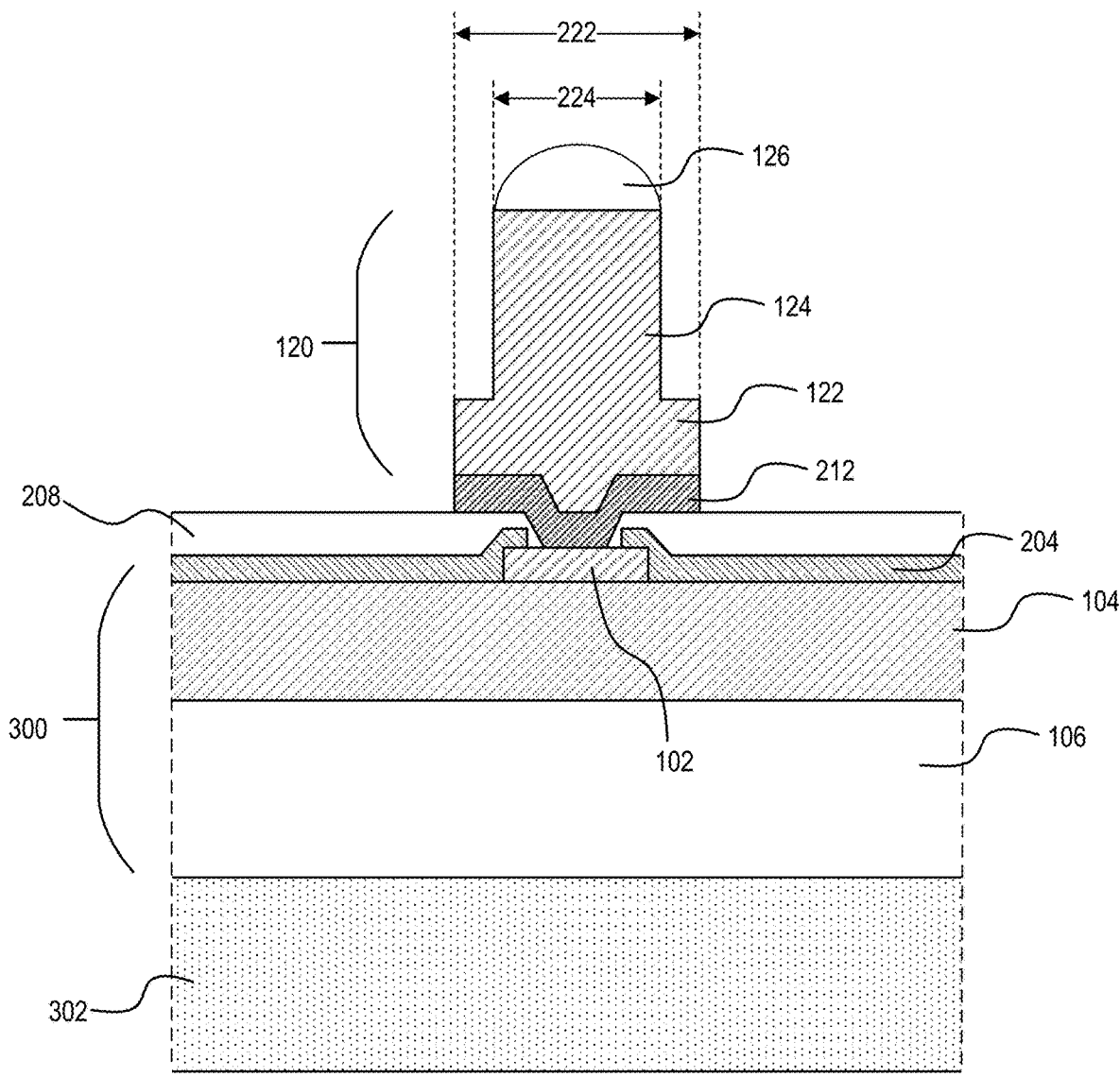
FIG. 14 is another portion of the example process flow for fabricating a semiconductor chip having stepped conductive pillars according to some implementations.

FIG. 14 sets forth a sectional view that depicts the formation of solder caps 126 on the end portion 124 of the conductive pillar 120. In some implementations, solder material is deposited on the planar surface of the end portion 124. In some examples, a diffusion barrier layer (not shown) is formed on the planar surface of the end portion 124 prior to depositing the solder material. The diffusion barrier layer can be composed of nickel (Ni), or the like. Finally, a solder reflow process is performed.

Figure 15:
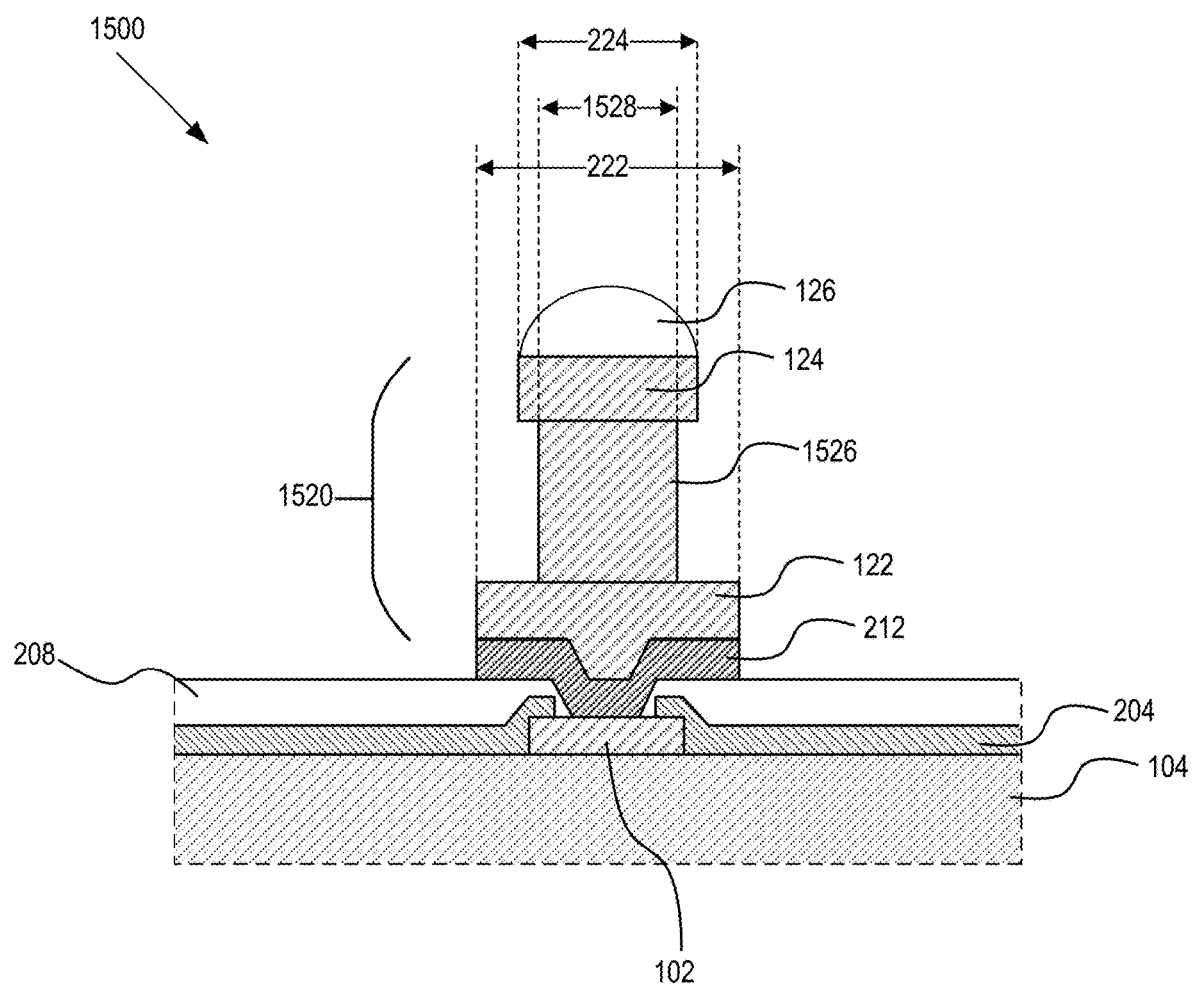
FIG. 15 sets forth a detailed sectional view of another implementation of a semiconductor chip having stepped conductive pillars according to some implementations.

The techniques described herein can be expanded to include stepped conductive pillar arrangements other than those depicted in FIGS. 1 and 2. For further explanation, FIG. 15 sets forth a detailed view of another example semiconductor chip 1500 having another example stepped conductive pillar 1520. Like the example semiconductor chip 100 detailed in FIG. 2, the example semiconductor chip 1500 includes a device layer, an interconnect layer 104, a conductive pad 102, a passivation layer 204, a polymer layer 208, and a UBM layer 212. The example semiconductor chip 1500 is different from the example semiconductor chip 100 in that the conductive pillar 1520 includes a middle portion 1526 disposed between the base portion 122 and the end portion 124. In some implementations, the base portion 122, the end portion 124, and middle portion 1526 form a stepped cylinder. In these implementations, the middle portion width 1528 is smaller than both the base portion width 222 and the end portion width 224. In other implementations, the base portion 122, the end portion 124, and middle portion 1526 form a stepped cuboid (described below). In these implementations, the largest width of the middle portion is smaller than the largest width of the base portion 122 and smaller than the largest width of the end portion 124. The example of FIG. 15 also includes the solder cap 126 on the end portion 124.

An example process flow for fabricating a semiconductor chip such as the semiconductor chip 1600 is similar to the process flow depicted in FIGS. 3-14 except that a third level of photoresist material is dispensed and exposed and another portion of the conductive post is formed, as described above with reference to FIGS. 9-12. The middle portion 1526 is fabricated using the second level of photoresist material 902 as a mask, while the end portion 124 is fabricated using an additional third level of photoresist material (not depicted) as a mask.

Figure 16:
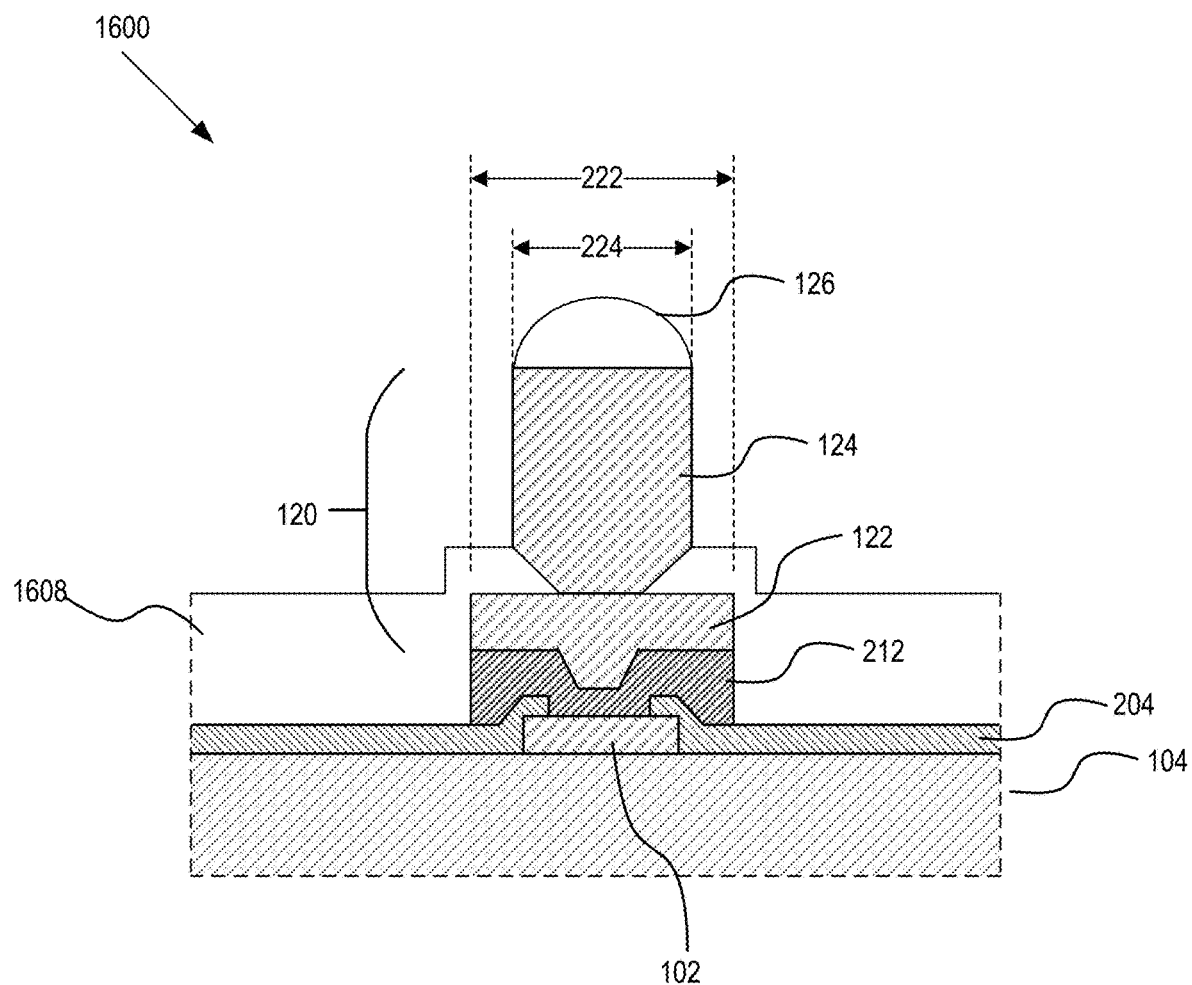
FIG. 16 sets forth a detailed sectional view of another implementation of a semiconductor chip having stepped conductive pillars according to some implementations.

For further explanation, FIG. 16 sets forth a detailed view of another example semiconductor chip 1600. The example semiconductor chip 1600 is different from the example semiconductor chip 100 in that a polymer layer 1608 is formed over the UBM layer 212 instead of on the passivation layer 204, such that the polymer layer 1608 overlies the UBM layer 212 and the base portion 122 of the conductive pillar 120 as well as the passivation layer 204. The example of FIG. 16 also includes the solder cap 126 on the end portion 124.

An example process flow for fabricating a semiconductor chip such as the semiconductor chip 1600 is similar to the process flow depicted in FIGS. 3-14 except that the deposition of the polymer layer 208 at the stage depicted in FIG. 4 is omitted. Additionally, after removal of the adhesion layer 502 and the seed layer 504 from around the conductive pillar 120 at the stage depicted in FIG. 13, the polymer layer 1608 is deposited. The polymer layer 1608 can be composed of a variety of polymeric materials.

Figure 17:
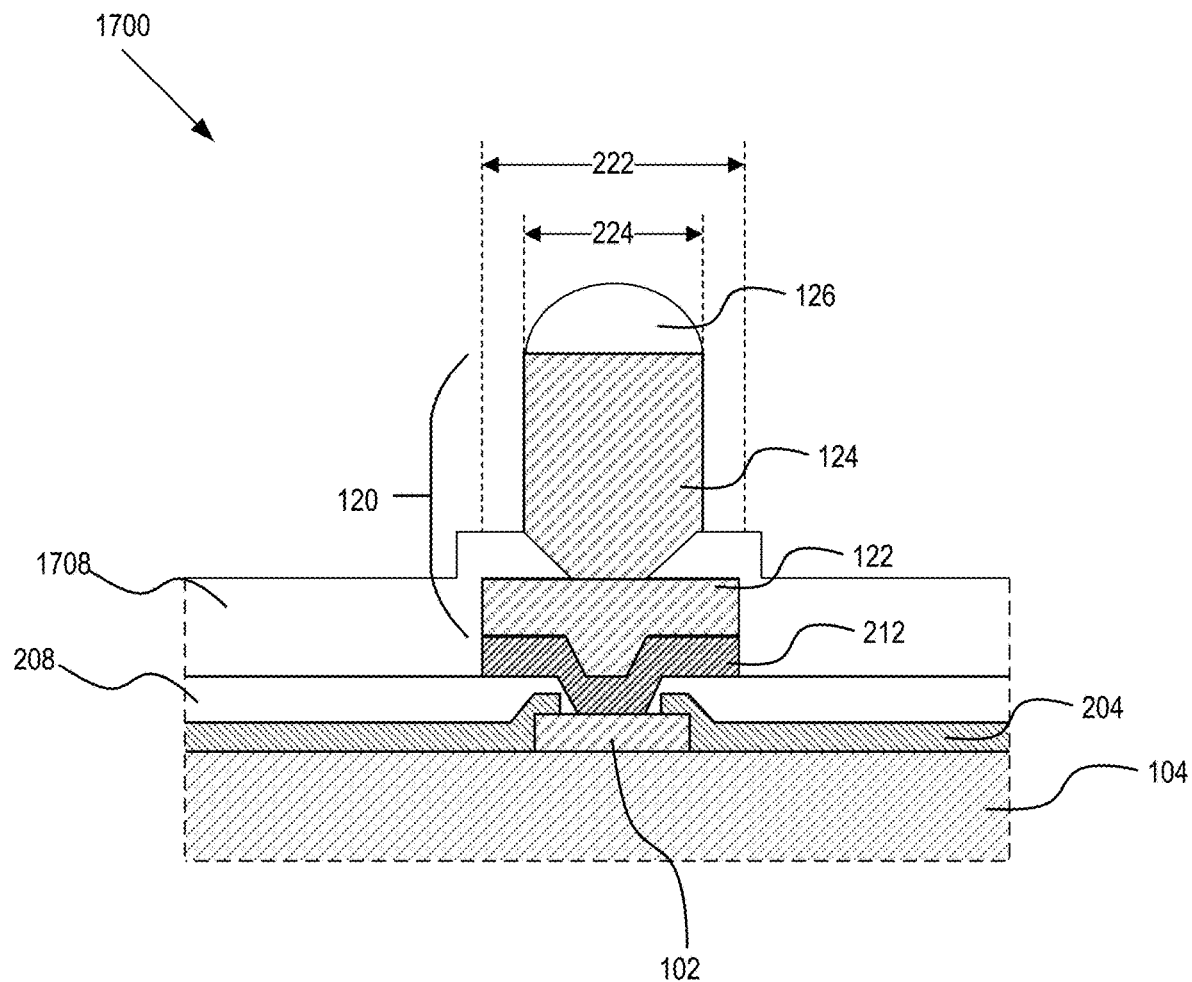
FIG. 17 sets forth a detailed sectional view of another implementation of a semiconductor chip having stepped conductive pillars according to some implementations.

For further explanation, FIG. 17 sets forth a detailed view of another example semiconductor chip 1700. The example semiconductor chip 1700 is different from the example semiconductor chip 100 in that a second polymer layer 1708 is formed over the UBM layer 212, such that the polymer layer 1708 overlies the polymer layer 208, the passivation layer 204, the UBM layer 212, and the base portion 122 of the conductive pillar 120. The example of FIG. 17 also includes the solder cap 126 on the end portion 124.

An example process flow for fabricating a semiconductor chip such as the semiconductor chip 1700 is similar to the process flow depicted in FIGS. 3-14 with the addition that, after removal of the adhesion layer 502 and the seed layer 504 from around the conductive pillar 120 at the stage depicted in FIG. 13, the polymer layer 1708 is deposited. The polymer layer 1708 can be composed of a variety of polymeric materials.

Figure 18A:
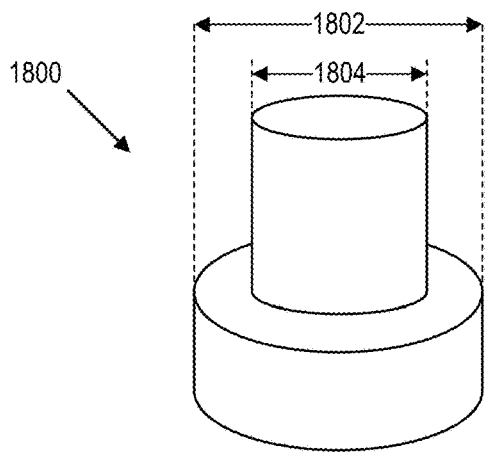
FIG. 18A sets forth a perspective view of an example shape of a stepped conductive pillar according to some implementations.

FIG. 18A sets forth an illustration of an example stepped circular-cylindrical conductive pillar 1800 in accordance with some implementations. The base portion and end portion of the circular-cylindrical conductive pillar 1800 each include opposing identical circular faces separated by a cylindrical sidewall. As each face of the base portion and the end portion are circular, the conductive pillar has a base portion diameter and an end portion diameter, which are respectively the base portion width 1802 and the end portion width 1804.

Figure 18B:
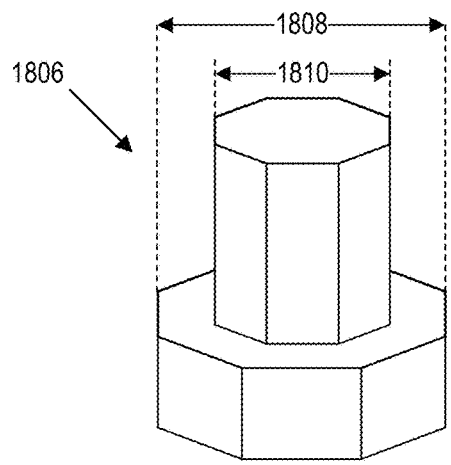
FIG. 18B sets forth a perspective view of an example shape of a stepped octagonal conductive pillar according to some implementations.

FIG. 18B sets forth an illustration of an example stepped octagonal conductive pillar 1806 in accordance with some implementations. The base portion and end portion of the octagonal conductive pillar 1806 each include opposing identical octagonal faces separated by an octagonal sidewall. As each face of the base portion and the end portion are octagonal, the conductive pillar has a base portion diameter and an end portion diameter, which are respectively the base portion width 1808 and the end portion width 1810.

Figure 18C:
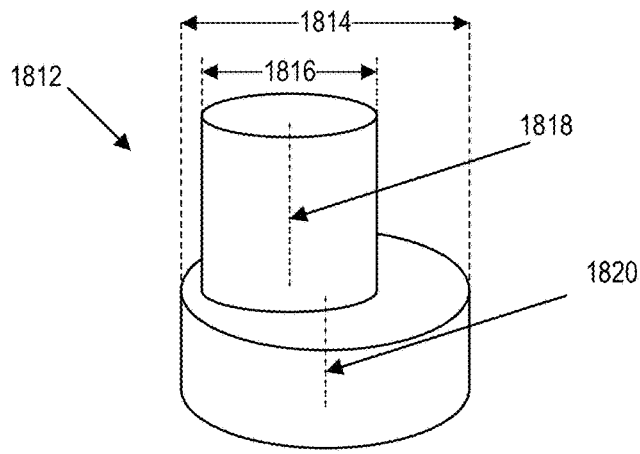
FIG. 18C sets forth a perspective view of an example shape of a stepped and offset conductive pillar according to some implementations.

FIG. 18C sets forth an illustration of an example stepped and offset circular-cylindrical conductive pillar 1812 in accordance with some implementations. The base portion and end portion of the circular-cylindrical conductive pillar 1812 each include opposing identical circular faces separated by a cylindrical sidewall. As each face of the base portion and the end portion are circular, the conductive pillar has a base portion diameter and an end portion diameter, which are respectively the base portion width 1814 and the end portion width 1816. In addition, the end portion has an axis 1818 that is off-center with respect to the axis 1820 of the base portion.

Figure 19:
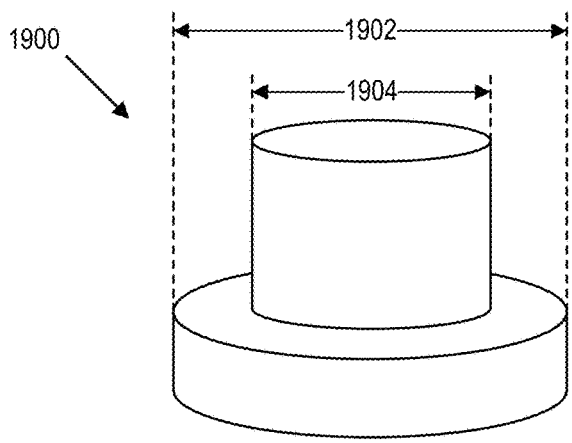
FIG. 19 sets forth a perspective view of another example shape of a stepped conductive pillar according to some implementations.

FIG. 19 sets forth an illustration of an example stepped elliptical-cylindrical conductive pillar 1900 in accordance with some implementations. The base portion and end portion of the elliptical-cylindrical conductive pillar 1900 each include opposing identical elliptical faces separated by a cylindrical sidewall. As each face of the base portion and of the end portion are ellipses, the respective faces each include a major axis and a minor axis, where the width of the base portion is considered the width along its major axis (i.e., the largest width) and the width of the end portion is considered the width along its major axis (i.e., the largest width). Thus, the conductive pillar has a base portion width 1902 and an end portion width 1904.

Figure 20:
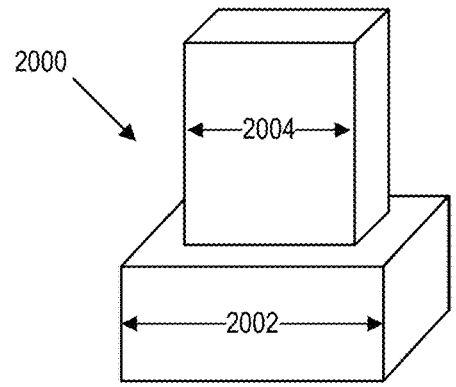
FIG. 20 sets forth a perspective view of yet another example shape of a stepped conductive pillar according to some implementations FIG. 21 sets forth a flowchart of an example method of fabricating a semiconductor chip having stepped conductive pillars according to some implementations.

FIG. 20 sets forth an illustration of an example stepped cuboid conductive pillar 2000 in accordance with some implementations. The base portion and end portion of the stepped cuboid conductive pillar 2000 are cuboids that each include four rectangular (or square) lateral faces forming sidewalls. Here, the width of the base portion is considered the largest width between its lateral faces and the width of the end portion is considered the largest width between its lateral faces. Thus, the conductive pillar has a base portion width 2002 and an end portion width 2004.

Figure 21:
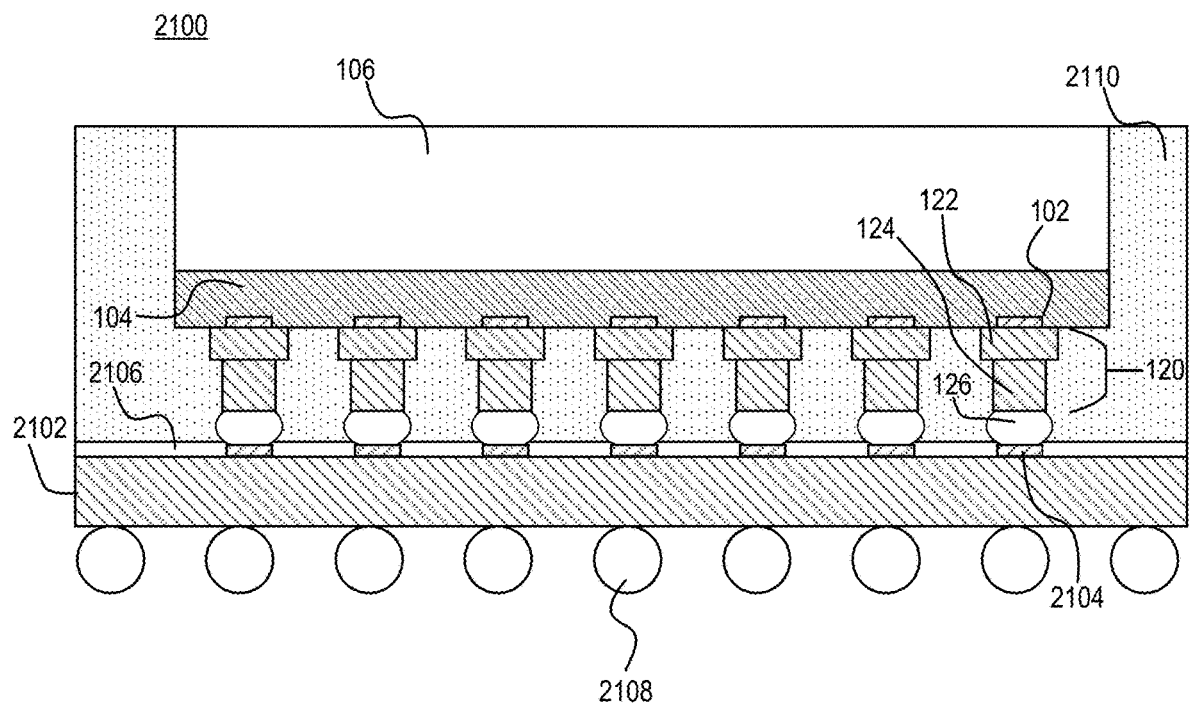

FIG. 21 sets forth a sectional view of an example semiconductor package 2100 implementing stepped conductive pillar interconnects on a semiconductor chip in accordance with some implementations of the present disclosure. In the example of FIG. 21, the semiconductor chip 100 of FIG. 1 is mounted on a substrate 2102 that includes multiple bond pads 2104 on a surface of the substrate. A solder mask 2106 is provided of the surface of the substrate 2102 and includes apertures at least partially exposing the bond pads 2104. In some examples, the substrate 2102 incudes a redistribution layer or other conductive structures (not depicted) that fanout electrical pathways from the conductive pads of the semiconductor chip 100 to package interconnects 2108 (e.g., solder balls).

In some examples, the semiconductor chip 100 and conductive pillars 120 are encased in one or more underfill or mold layers 2110. It should be noted that the width of the base portion 122 reduces stress on the ELK dielectric material in the semiconductor chip 100, while the smaller width of the end portion 124 provides greater separation between adjacent solder structures 126 to mitigate against solder bridging. The reduction of the ELK stress mitigates against delamination. Also, there is no need to reduce the size of the solder mask apertures that expose the bond pad 2104 to reduce ELK dielectric material stress as the base portion width is sufficient to reduce the stress on the ELK dielectric material.

For further explanation, FIG. 22 sets forth an example method of fabricating stepped conductive pillar interconnects on a semiconductor chip in accordance with some implementations. The example method of FIG. 22 includes providing 2202 a semiconductor chip substrate including a conductive pad and a passivation layer through which the conductive pad is at least partially exposed. In some implementations, providing 2202 the semiconductor chip substrate is carried out by placing a semiconductor chip substrate (e.g., the semiconductor chip substrate 300 in FIG. 3) on a carrier (e.g., the carrier 302). An example of the semiconductor chip substrate includes a device layer implementing integrated circuit devices such as transistor, capacitors, and the like. The semiconductor chip substrate also includes an interconnect layer composed of layers of metallization and dielectric material. The layers of metallization include conductive structures such as conductive traces, pads, and vias interspersed in the dielectric material. In some examples, the dielectric material is ELK or ultra low-k (ULK) dielectric material having a k-value less than 3. Multiple conductive pads are formed in a final layer of metallization on the active surface of the example semiconductor chip substrate. A passivation layer overlays the active surface of the example semiconductor chip substrate. The passivation layer includes apertures over the conductive pads that at least partially expose the conductive pads. In some examples, the semiconductor chip substrate is attached to the carrier by an adhesive film or through other well-known techniques.

The method of FIG. 22 also includes fabricating 2204 an under-bump metallization layer over an exposed portion of the conductive pad. Such fabrication 2204 is carried out by depositing a layer of metal that acts as an adhesion layer to support the conductive pillar. In some examples, the metal of the adhesion layer is titanium (Ti). The adhesion layer can also act as a diffusion barrier. In some implementations, fabricating 2204 the under-bump metallization layer is also carried out by depositing a layer of metal that acts a seed layer to wet the adhesion layer for fabrication of the conductive pillar. In some examples, the metal of the seed layer is copper (Cu). After fabrication of the conductive pillar is complete, the adhesion layer and seed layer are etched away except for underneath the conductive pillar. The adhesion layer forms the under-bump metallization layer (e.g., the under-bump metallization layer 212 in FIG. 2). A chemical etching can be performed to remove portions of the seed layer and adhesion layer. In some implementations, fabricating 2204 the under-bump metallization layer is carried out as shown and described with references to FIGS. 5 and 13. In some examples, the metal of the adhesion layer and seed layer is deposited on a polymer (e.g., polyimide) layer formed on the passivation layer. The metal of the adhesion layer and the metal of the seed layer are electrically coupled to the conductive pad.

The method of FIG. 22 also includes fabricating 2206 a first portion of the conductive pillar over the conductive pad. The first portion of the conductive pillar has a first width. Fabricating 2206 the first portion is carried out by creating a base portion of the conductive pillar on the seed layer of metal above the conductive pad. The base portion can be fabricated into a variety of shapes, including a circular cylinder, an elliptical cylinder, a cuboid shape, a polygonal cylinder (such as an octagonal cylinder), and the like. In some examples, the base portion is fabricated by electroplating metal within a cavity defined by a resist layer formed on the surface of the seed layer. In some examples, a photolithographic process is employed to create the cavity. In some implementations, fabricating 2206 the first portion of the conductive pillar over the conductive pad is carried out as shown and described with reference to FIGS. 6-8.

The method of FIG. 22 also includes fabricating 2208 a second portion of the conductive pillar on the first portion. The second portion has a second width that is smaller than the first width. Fabricating 2208 the second portion is carried out by creating a base portion of the conductive pillar on the seed layer of metal above the conductive pad. The base portion can be fabricated into a variety of shapes, including a circular cylinder, an elliptical cylinder, a cuboid shape, and the like. In some examples, the base portion is fabricated by electroplating metal within a cavity defined by a resist layer formed on the surface of the seed layer. In some examples, a photolithographic process, such as described below, is employed to create the cavity. In some examples, fabricating 2208 the second portion of the conductive pillar on the first portion is carried out as shown and described with reference to FIGS. 9-11.

Figure 23:
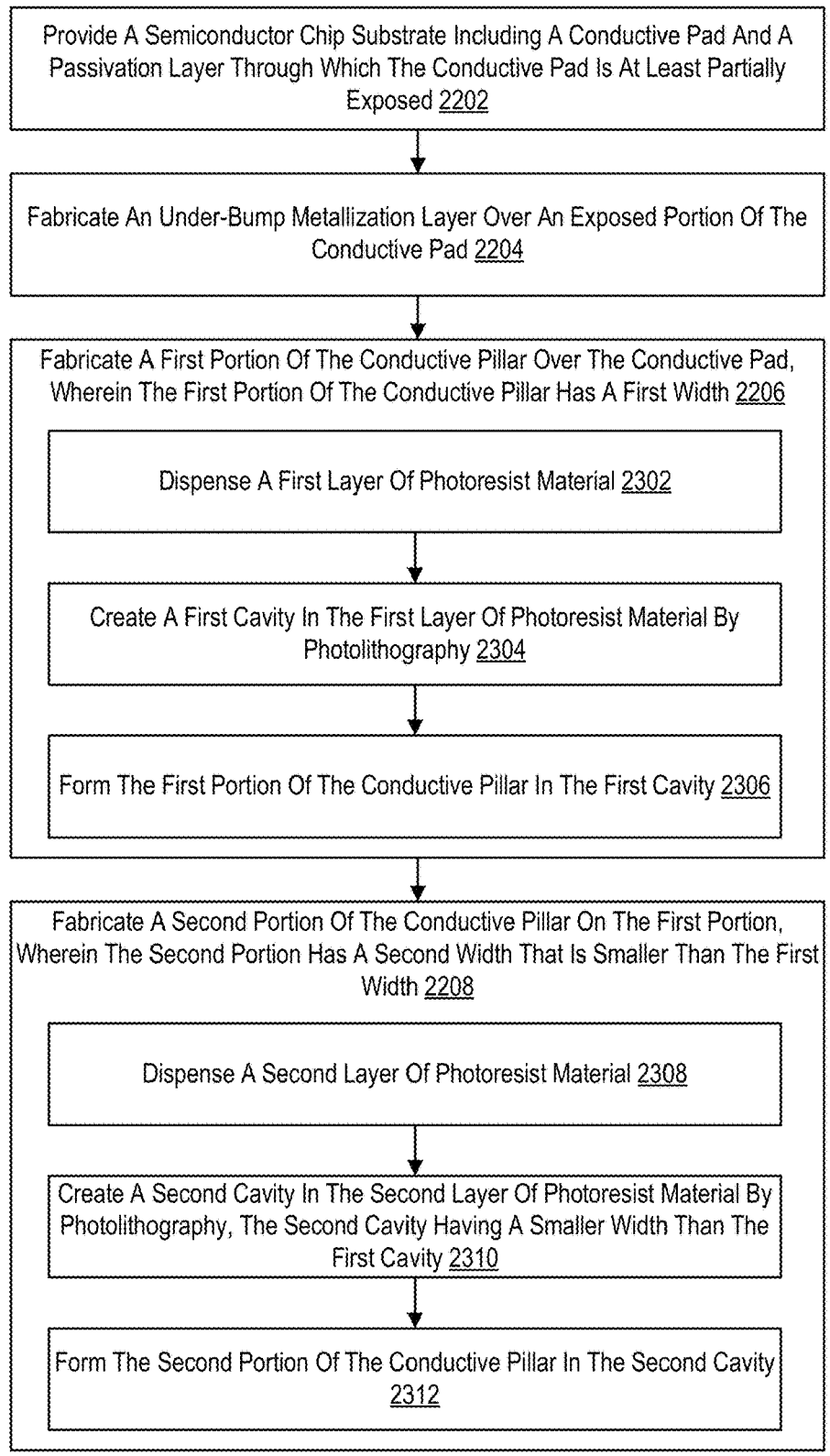
FIG. 23 sets forth an additional flowchart of the example method of fabricating a semiconductor chip having stepped conductive pillars according to some implementations.

For further explanation, FIG. 23 sets forth variations of fabricating stepped conductive pillar interconnects on a semiconductor chip in accordance with some implementations. In the example of FIG. 23, fabricating 2206 the first portion of the conductive pillar over the conductive pad includes dispensing 2302 a first layer of photoresist material. In some examples, dispensing 2302 a first layer of photoresist material is carried out by spin coating photoresist material on the seed layer.

In the example of FIG. 23, fabricating 2206 the first portion of the conductive pillar also includes creating 2304 a first cavity in the first layer of photoresist material by photolithography. In some implementations, creating 2304 a first cavity in the first layer of photoresist material is carried out by exposing a portion of the photoresist material over the conductive pad to radiation (e.g., UV light) and developing the photoresist material to remove the portion of the photoresist material that was exposed.

In the example of FIG. 23, fabricating 2206 the first portion of the conductive pillar also includes forming 2306 the first portion of the conductive pillar by electroplating metal in the first cavity. In some implementations, forming 2306 the first portion of the conductive pillar is carried out by electroplating metal such as copper on the seed layer within the cavity in the photoresist material.

In the example of FIG. 23, fabricating 2208 a second portion of the conductive pillar includes dispensing 2308 a second layer of photoresist material. In some implementations, dispensing 2308 a second layer of photoresist material is carried out by spin coating photoresist material on the first layer of photoresist material and the fabricated base portion of the conductive pillar.

In the example method of FIG. 23, fabricating 2208 a second portion of the conductive pillar on the first portion also includes creating 2310 a second cavity in the second layer of photoresist material by photolithography. The second cavity has a smaller width than the first cavity. In some implementations, creating 2310 the second cavity is carried out by exposing a portion of the second layer of photoresist material over the conductive pad to radiation (e.g., UV light), developing the photoresist material to remove the portion of the photoresist material that was exposed.

In the example method of FIG. 23, fabricating 2208 a second portion of the conductive pillar on the first portion also includes forming 2312 the second portion of the conductive pillar in the second cavity. In some implementations, forming 2312 the second portion of the conductive pillar in the second cavity is carried out by electroplating metal such as copper on top surfaces of the base portion and the first layer of photoresist material that forms the floor of the cavity in the photoresist material.

In view of the foregoing, it will be appreciated that a number of advantages are realized by stepped conductive pillar interconnects on a semiconductor chip. The smaller width of the end portion of the stepped conductive pillar allows for a fine pitch among the solder joints while mitigating the occurrence solder bridging. The greater width of the base portion of the stepped conductive pillar allows for a wider UBM layer that mitigates ELK dielectric layer stress, thus mitigating the occurrence of cracking or delamination in the semiconductor chip.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor chip comprising:
   a device layer;
   an interconnect layer fabricated on the device layer, the interconnect layer including a conductive pad disposed on a final dielectric layer of the interconnect layer; and
   a conductive pillar coupled to the conductive pad and including at least a first portion having a first width and a second portion having a second width, the first portion being disposed between the second portion and the conductive pad, wherein the first width of the first portion is greater than the second width of the second portion.

2. The semiconductor chip of claim 1 further comprising a solder cap on an end of the second portion.

3. The semiconductor chip of claim 1, wherein the conductive pillar includes a third portion disposed between the first portion and the second portion, the third portion having a third width that is smaller than the second width.

4. The semiconductor chip of claim 1 further comprising:
   a passivation layer formed on the interconnect layer;
   a polymer layer formed on the passivation layer;
   an aperture through the passivation layer and the polymer layer, the aperture exposing a portion of the conductive pad; and
   an under-bump metallization layer formed on at least the exposed portion of the conductive pad and coupling the conductive pillar to the conductive pad.

5. The semiconductor chip of claim 1 further comprising:
   a passivation layer formed on the interconnect layer;
   an aperture in the passivation layer, the aperture exposing a portion of the conductive pad;
   an under-bump metallization layer formed on at least the exposed portion of the conductive pad and coupling the conductive pillar to the conductive pad; and
   a polymer layer formed on the first portion of the conductive pillar and the under-bump metallization layer.

6. The semiconductor chip of claim 1 further comprising:
   a passivation layer formed on the interconnect layer;
   a first polymer layer formed on the passivation layer;
   an aperture in the passivation layer and the first polymer layer, the aperture exposing a portion of the conductive pad;
   an under-bump metallization layer formed on at least the exposed portion of the conductive pad and coupling the conductive pillar to the conductive pad; and
   a second polymer layer formed on the first portion of the conductive pillar and the under-bump metallization layer.

7. The semiconductor chip of claim 1, wherein the conductive pillar forms a stepped cylinder.

8. The semiconductor chip of claim 1, wherein the conductive pillar forms a stepped cuboid.

9. The semiconductor chip of claim 1, wherein the interconnect layer includes extremely low-k (ELK) dielectric material.

10. A semiconductor chip package comprising:
    a package substrate including a bond pad; and
    a semiconductor chip mounted on the package substrate, the semiconductor chip including:
    a device layer;
    an interconnect layer fabricated on the device layer, the interconnect layer including a conductive pad disposed on a final dielectric layer of the interconnect layer; and
    a conductive pillar interconnecting the conductive pad and the bond pad of the package substrate, the conductive pillar including at least a first portion having a first width and a second portion having a second width, the first portion being disposed between the second portion and the conductive pad, the second portion being disposed between the first portion and the package substrate, wherein the first width of the first portion is greater than the second width of the second portion.

11. The semiconductor chip package of claim 10 further comprising a solder cap on an end of the second portion.

12. The semiconductor chip package of claim 10, wherein the conductive pillar includes a third portion disposed between the first portion and the second portion, the third portion having a third width that is smaller than the second width.

13. The semiconductor chip package of claim 10 further comprising:
- a passivation layer formed on the interconnect layer;
- a polymer layer formed on the passivation layer;
- an aperture through the passivation layer and the polymer layer, the aperture exposing a portion of the conductive pad; and
- an under-bump metallization layer formed on at least the exposed portion of the conductive pad and coupling the conductive pillar to the conductive pad.

14. The semiconductor chip package of claim 10 further comprising:
- a passivation layer formed on the interconnect layer;
- an aperture in the passivation layer, the aperture exposing a portion of the conductive pad;
- an under-bump metallization layer formed on at least the exposed portion of the conductive pad and coupling the conductive pillar to the conductive pad; and
- a polymer layer formed on the first portion of the conductive pillar and the under-bump metallization layer.

15. The semiconductor chip package of claim 10 further comprising:
- a passivation layer formed on the interconnect layer;
- a first polymer layer formed on the passivation layer;
- an aperture in the passivation layer and the first polymer layer, the aperture exposing a portion of the conductive pad;
- an under-bump metallization layer formed on at least the exposed portion of the conductive pad and coupling the conductive pillar to the conductive pad; and
- a second polymer layer formed on the first portion of the conductive pillar and the under-bump metallization layer.

16. The semiconductor chip package of claim 10, wherein the conductive pillar forms a stepped cylinder.

17. The semiconductor chip package of claim 10, wherein the interconnect layer includes extremely low-k (ELK) dielectric material.

18. A method of fabricating a semiconductor device having stepped conductive pillars, the method comprising:
- providing a semiconductor chip substrate including an interconnect layer, a conductive pad disposed on a final dielectric layer of the interconnect layer, and a passivation layer through which the conductive pad is at least partially exposed;
- fabricating an under-bump metallization layer over an exposed portion of the conductive pad;
- fabricating a first portion of a conductive pillar over the conductive pad, wherein the first portion of the conductive pillar has a first width; and
- fabricating a second portion of the conductive pillar on the first portion, wherein the second portion has a second width that is smaller than the first width.

19. The method of claim 18, wherein:
fabricating a first portion of the conductive pillar over the conductive pad further comprises: dispensing a first layer of photoresist material; creating a first cavity in the first layer of photoresist material by photolithography; and forming the first portion of the conductive pillar in the first cavity; and
fabricating a second portion of the conductive pillar on the first portion further comprises: dispensing a second layer of photoresist material; creating a second cavity in the second layer of photoresist material by photolithography, the second cavity having a smaller width than the first cavity; and forming the second portion of the conductive pillar in the second cavity.

20. The method of claim 18, wherein the conductive pillar forms a stepped cylinder.

* * * * *